(12) United States Patent
Sehgal et al.

(10) Patent No.: US 10,573,397 B1
(45) Date of Patent: Feb. 25, 2020

(54) PARAMETER TRACKING FOR NON-VOLATILE MEMORY TO AVOID OVER-PROGRAMMING

(71) Applicant: Western Digital Technologies, Inc., San Jose, CA (US)

(72) Inventors: Rohit Sehgal, San Jose, CA (US); Sahil Sharma, San Jose, CA (US); Philip Reusswig, Mountain View, CA (US); Nian Niles Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/209,519

(22) Filed: Dec. 4, 2018

(51) Int. Cl.
*G11C 16/34* (2006.01)
*G11C 11/56* (2006.01)
*G06F 11/07* (2006.01)

(52) U.S. Cl.
CPC ........ *G11C 16/3459* (2013.01); *G06F 11/076* (2013.01); *G11C 11/5628* (2013.01); *G11C 16/3431* (2013.01)

(58) Field of Classification Search
CPC ............ G11C 16/3459; G11C 11/5628; G11C 16/3431; G06F 11/076
See application file for complete search history.

(56) References Cited

U.S. PATENT DOCUMENTS

| 9,606,865 | B2 * | 3/2017 | Yang | G06F 11/1068 |
| 9,606,882 | B2 * | 3/2017 | Creasman | G06F 11/2094 |
| 9,892,794 | B2 * | 2/2018 | Micheloni | G11C 16/14 |

* cited by examiner

*Primary Examiner* — Gene N Auduong
(74) *Attorney, Agent, or Firm* — Vierra Magen Marcus LLP

(57) ABSTRACT

On a non-volatile memory circuit, peripheral circuitry generates programming voltages based on parameter values. If parameter values are incorrectly translated into programming voltages, data may be over-programmed, resulting in high bit error rates (BERs). The memory system can monitor the error rates using memory cell voltage distributions for different portions of the memory and look for signatures of such incorrect implementation. For example, by monitoring the BER along word lines that are most prone to error due to incorrectly implemented programming parameters, the memory system can determine if the programming parameters for the corresponding portion of a memory device indicate such anomalous behavior. If such a signature is found, the memory system checks to see whether the programming parameters should be adjusted, such as by comparing the programming parameters used on one die to programming parameters used on another die of the memory system, and adjust the programming parameters accordingly.

20 Claims, 20 Drawing Sheets

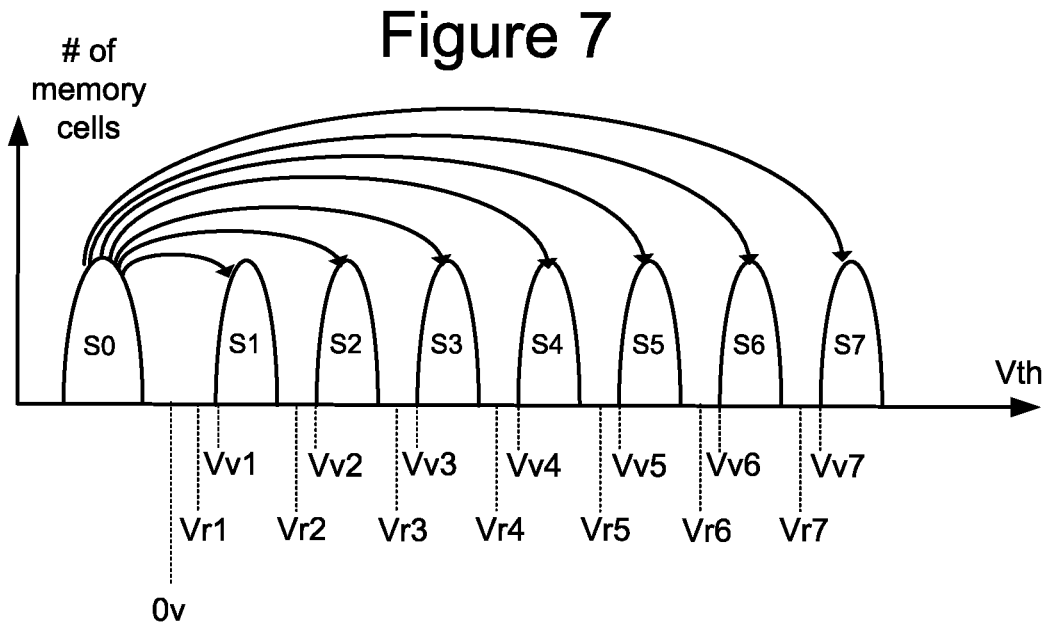
Figure 7
Figure 8
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
Figure 9C
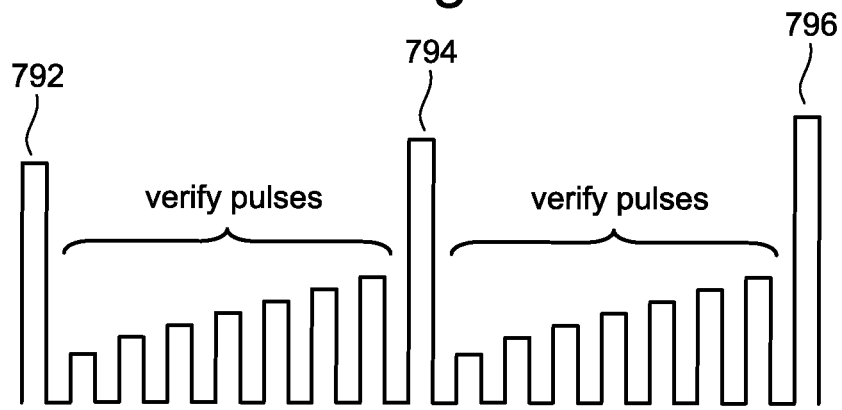

CVD=(*physical address range; time stamp;* [PP], [Vr], [Vv], ...; *BER*)

Figure 13

| Word Line Layer | Vpgm0, read fail die | Vpgm0, read pass die |
|---|---|---|
| WL group 1 | *VpgmU – 0.8V* | *VpgmU – 0.8V* |
| WL group 2 | *VpgmU – 0.4V* | *VpgmU – 0.4V* |
| WL group 3 | *VpgmU* | *VpgmU* |
| WL group 4 | *VpgmU + 0V* | *VpgmU + 0V* |
| WL group 5 | *VpgmU + 0.8V* | *VpgmU + 0.4V* |

PARAMETER TRACKING FOR NON-VOLATILE MEMORY TO AVOID OVER-PROGRAMMING

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that a memory system accurately writes the data, reads back the data and reports the data to the host device, client, user or other entity.

BRIEF DESCRIPTION OF THE DRAWINGS

Like-numbered elements refer to common components in the different figures.

FIG. 7 depicts threshold voltage distributions.

FIG. 8 is a table describing one example of an assignment of data values to data states.

FIG. 9C depicts a word line voltage during programming and verify operations.

FIG. 13 is a schematic representation of an embodiment for maintaining system metadata.

FIG. 15 is a table of examples of the Vpgm0 values used for different word line groups for a passing die and a failing die.

DETAILED DESCRIPTION

Figure 1:
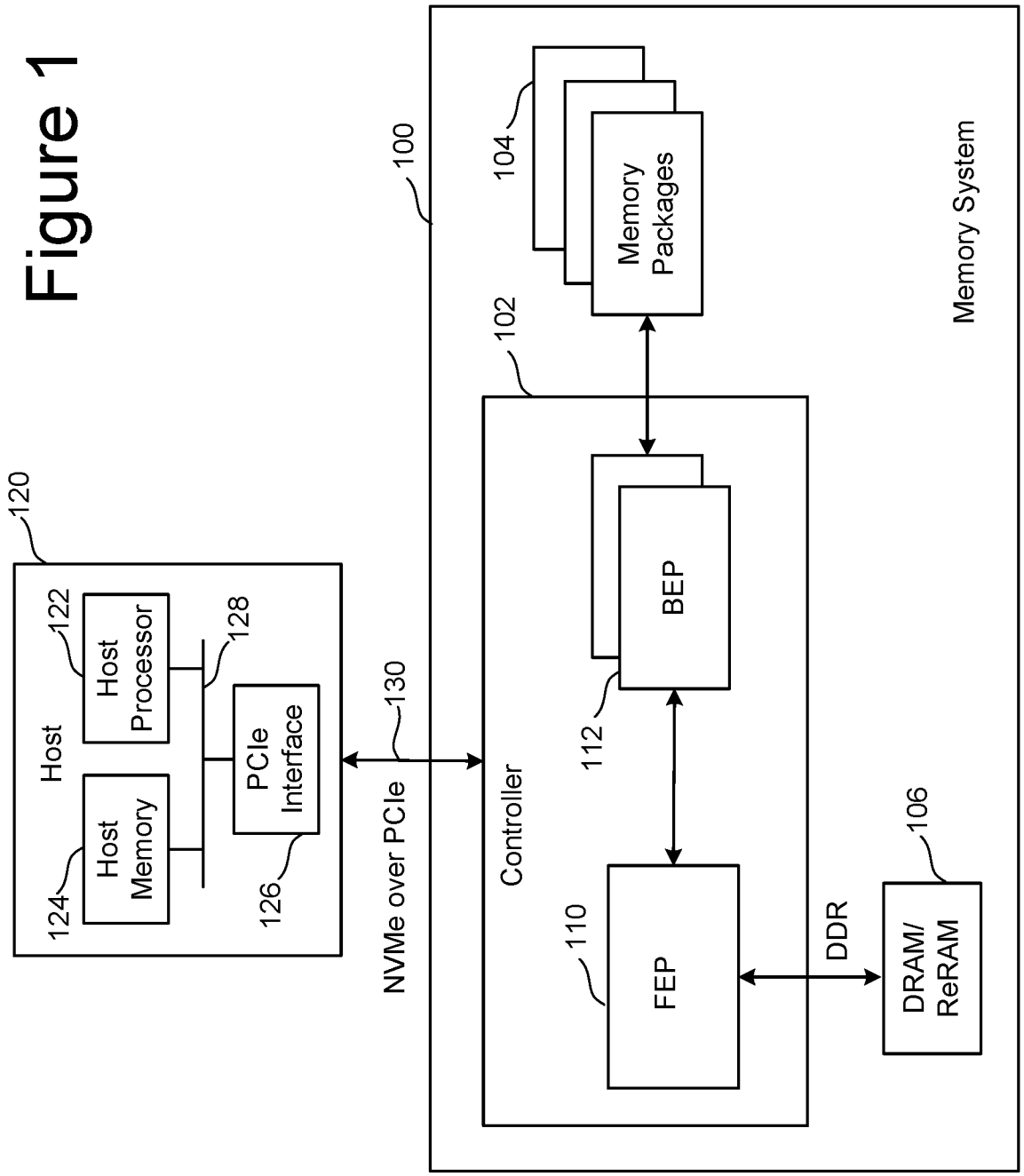
FIG. 1 is a block diagram of one embodiment of a memory system connected to a host.

A typical technique for programming a non-volatile memory, such as a NAND type memory with charge storing memory cells, is to apply a series of programming pulses of increasing voltage amplitude to the memory cells and verify the memory cells between pulses to determine the state of memory cell. The pulse incrementally increases the threshold voltage a memory cell. Using different read levels for different programming bits, or data states, the verify operation senses the resultant threshold voltage to determine whether the memory cell has reached its target data state, after which the memory cell is locked out from further programming. Such an arrangement can determine whether a memory cell is sufficiently programmed, but not whether it is over-programmed. In a memory device that stores multiple bits of data per memory cell (MLC memory), such as part of different pages of data (e.g., lower page, middle page, upper page), if a memory cell is over-programmed it will verify as correctly programmed to its target state, but may actually be programmed to a higher threshold voltage data state. In this situation, the over-programmed memory cell returns an incorrect data value when subsequently read. Memory systems commonly incorporate error correction techniques that can correct some amount of error, but if a memory device is over-programming large numbers of memory cells, this can overwhelm the memory system's error correction capability.

Over-programming at the individual memory cell level can result from a defective memory cell, but it can also arise on a larger scale if a programming algorithm is incorrectly implemented. If a staircase sequence of programming pulses begins at too high an initial voltage level, or increases too much from step to step, a memory cell being programmed to a target state may already be over-programmed the first time it is verified or increase more than the state-to-state separation in response to a single programming pulse. The characteristics of a programming waveform can be based on a set of parameters maintained by the memory system, where properties like the amplitude of the initial pulse and the step size can be set according to these parameters. To provide more accurate operation, the memory system can have different sets of parameters for different areas of the different memory die of the memory system, and even for different regions of a memory array. However, if these parameter values are incorrect, or incorrectly implemented, this can result in over-programming.

The programming parameters can be incorrect either due to being incorrect when the device is fresh, or because the properties of the device change over time so that programming parameters that were originally accurate are no longer so. As far as the incorrect implementation of parameters, the parameters are typically maintained by the memory system as digital values. A digital value is then translated into a voltage level by circuitry on the periphery of the memory area of a memory die, with the voltage then being applied by drivers and decoders for the memory array. If the peripheral circuit responsible for translating the digital programming parameter value into a voltage level is defective or becomes defective, the digital parameter will be mis-translated. For example, if a voltage level, such as the amplitude of an initial programming pulse, is set through a configurable resistor chain and some of the resistors are defective, this could result in the amplitude of the initial programming pulse being too high, even if the digital parameter used to set it was accurate. As such circuitry is formed on the periphery of the memory die, it can be particularly vulnerable to defects, both when new and as acquired over its lifetime.

To improve upon this situation, the memory system can monitor the error rates for different portions of the memory and look for signatures of error rates that indicate that the programming parameters are either incorrect or being incorrectly implemented. For example, by monitoring the memory cells' voltage distributions and their bit error rates (BER) along word lines that are most prone to error due to incorrectly implemented programming parameters, the memory system can determine if the programming parameters for the corresponding portion of a memory device display a signature of programming parameters that are either incorrect or being incorrectly implemented. If such a signature is found, the memory system can check the programming voltage being generated to see whether the programming parameters should be adjusted, such as by comparing the programming voltage generated from the programming parameter value on one die to programming voltage generated from the programming parameter value on another die of the memory system, and dynamically adjust the programming parameters on the die with the high BER on the fly.

FIG. 1 is a block diagram of one embodiment of a memory system 100 connected to a host 120. Memory system 100 can implement the technology proposed herein, where programming parameters can be tracked to avoid over-programming. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120. Controller 102 receives data from host 120. Controller 102 encodes the data with the corresponding level of ECC (error correction), forms the data into ECC codewords, forms the codewords into pages, and transfers the pages to the memory packages 104 to be written into memory.

Figure 2:
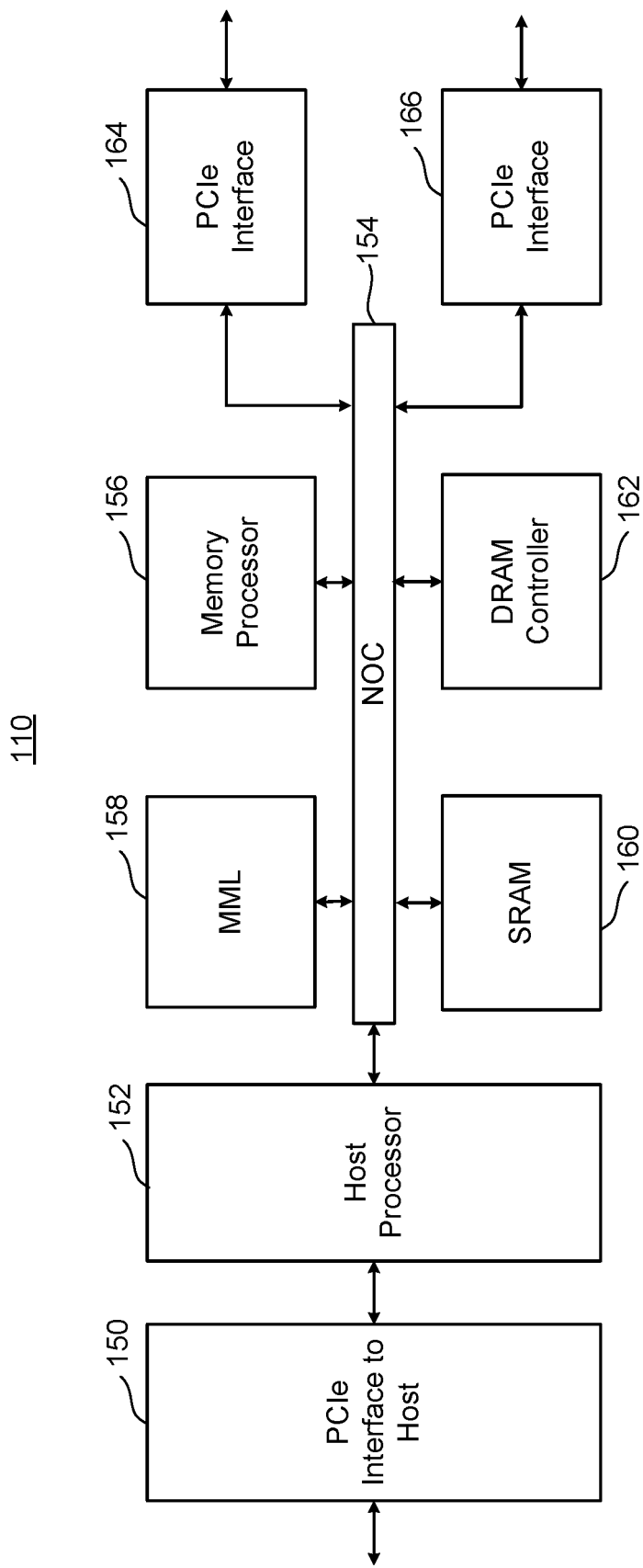
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
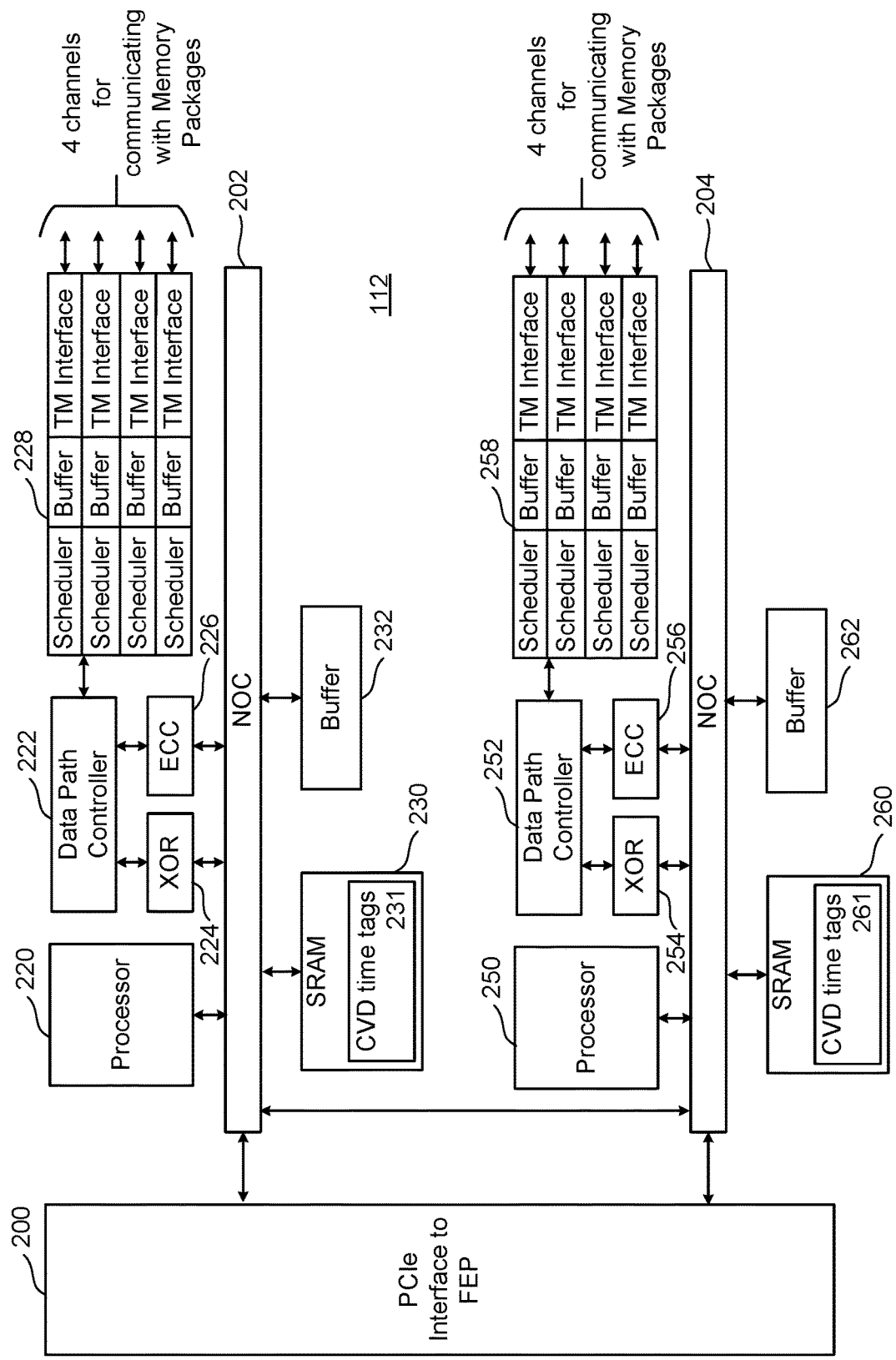
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The SRAM 230/260 can be used to hold operating parameters and other data for use by the processor 220/250, such as the CVD time tag data 231/261 discussed in further detail below with respect to FIG. 13. The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
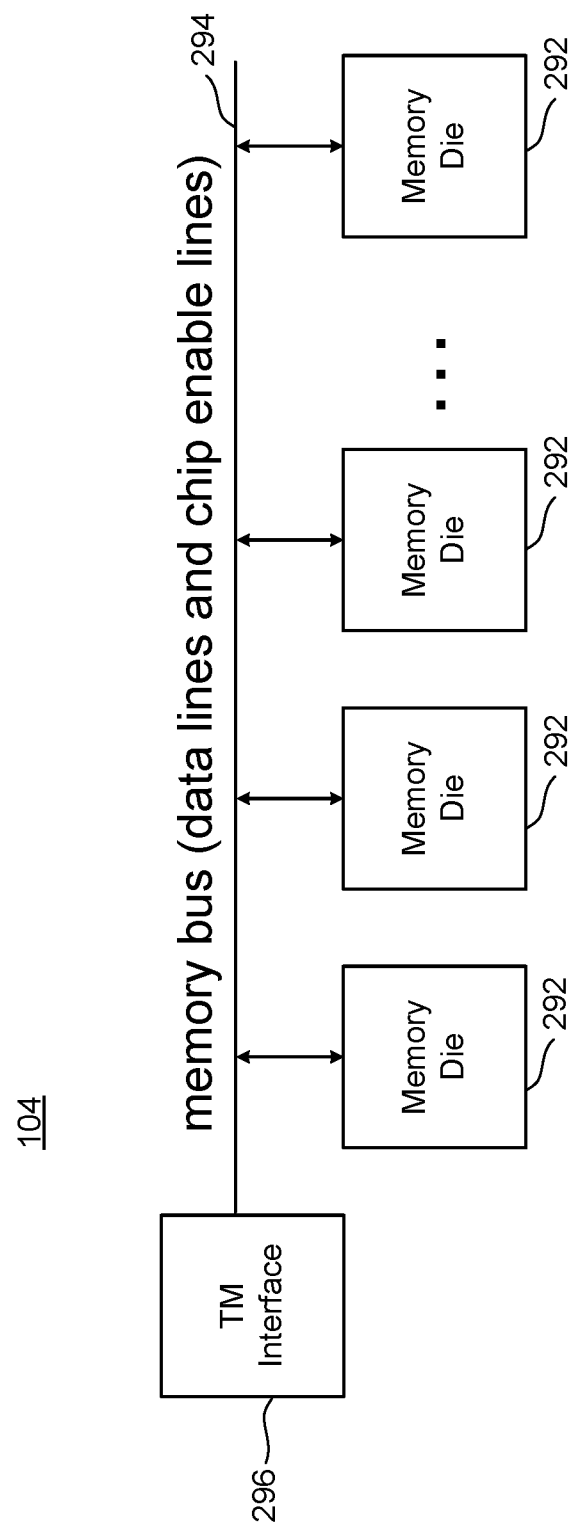
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
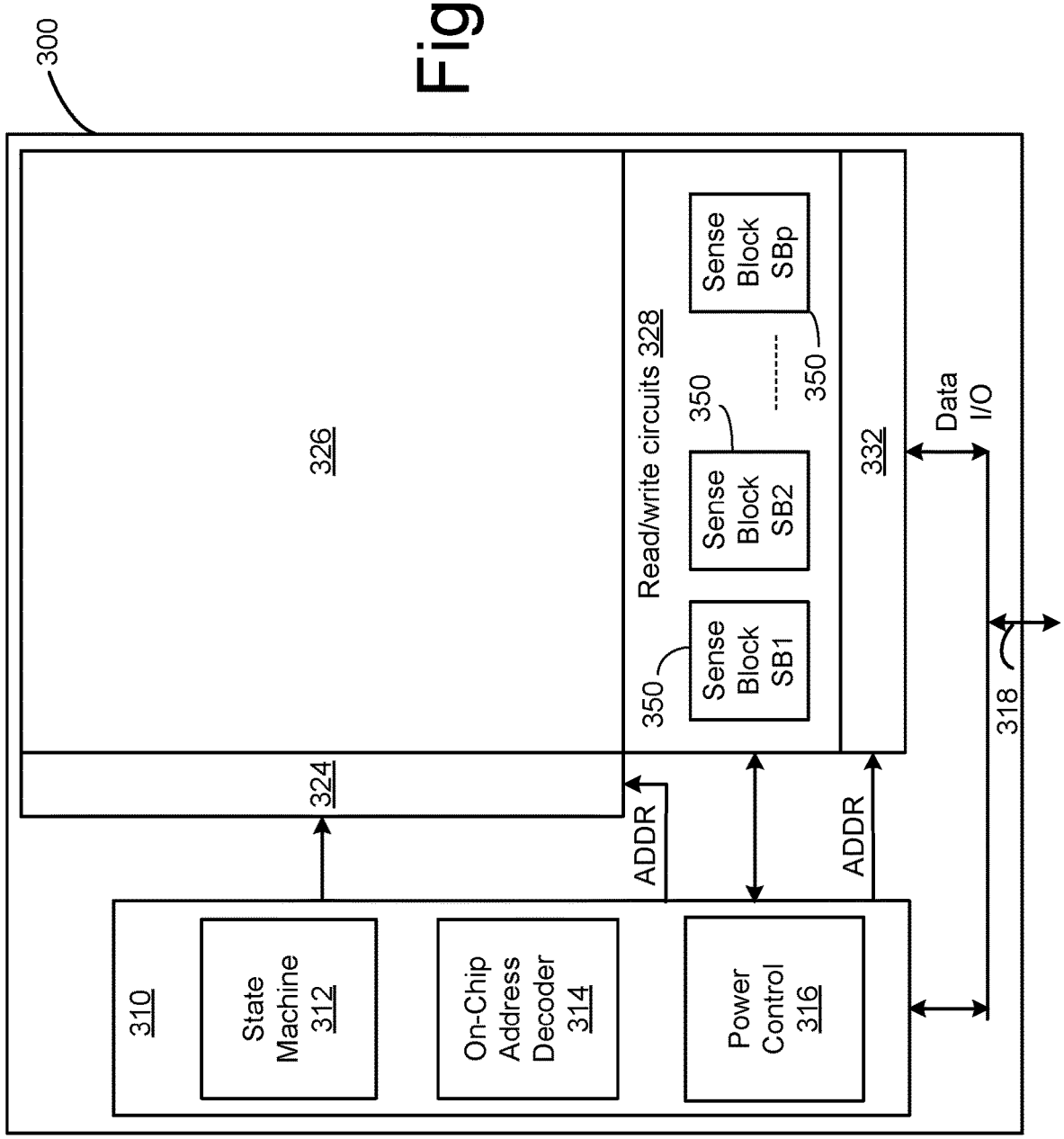
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. The sense blocks include bit line drivers. Commands and data are transferred between the Controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include voltage regulators and charge pumps for creating voltages. For example, the power control module 316 can translate digital operation parameters specifying the different operating voltages into voltage level. As an example, memory cell programming parameters can specify the starting voltage level of a programming waved form for different regions of the memory system's memory die. The translation of programming parameters into voltage level is discussed in more detail below.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 6A:
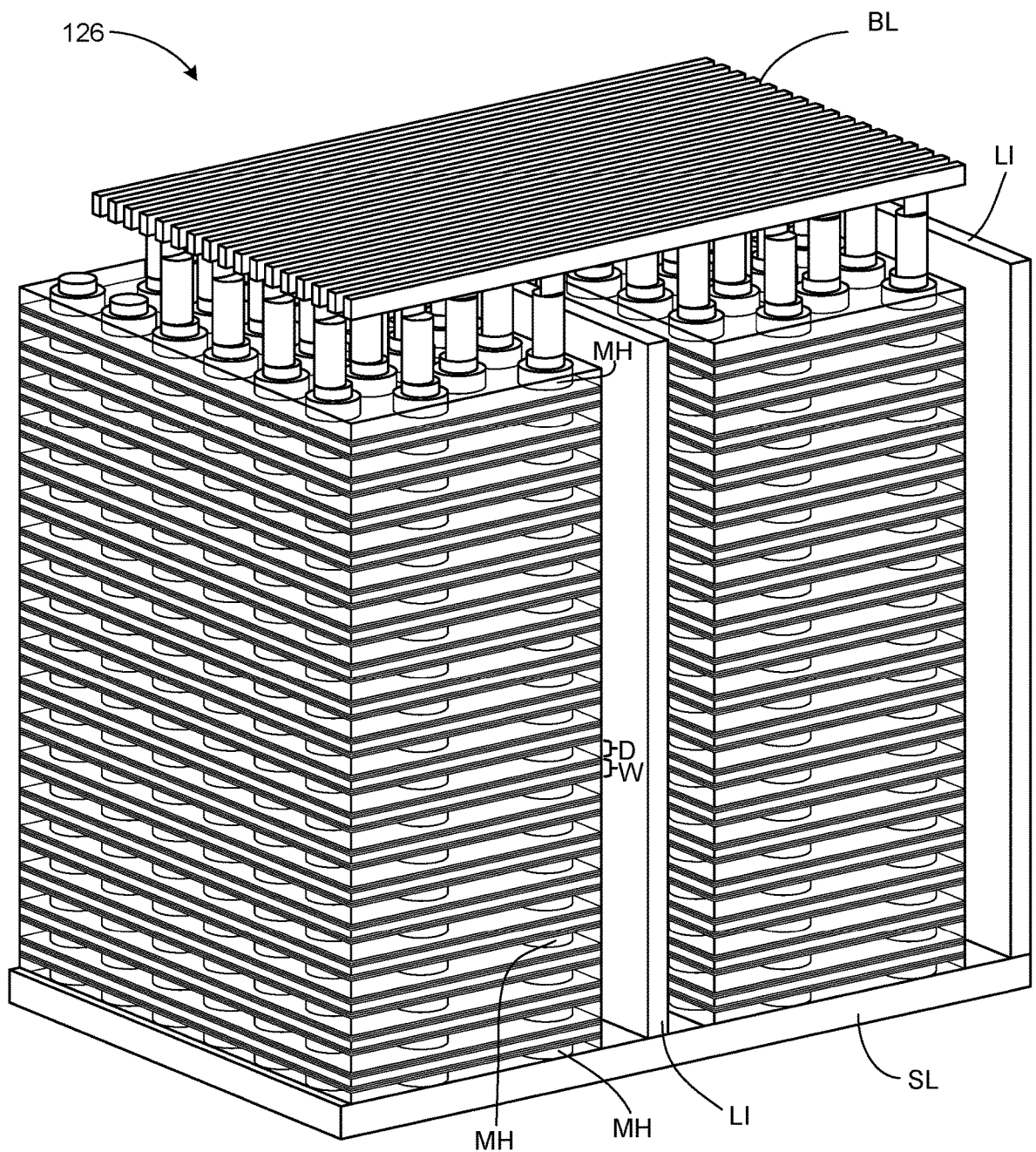
FIG. 6A is a perspective view of a portion of one embodiment of a monolithic three dimensional memory structure.

FIG. 6A is a perspective view of a portion of one example embodiment of a monolithic three dimensional memory array that can comprise memory structure 326 of FIG. 5, which includes a plurality non-volatile memory cells. For example, FIG. 6A shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 6A shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 6A the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 326 is provided below with respect to FIGS. 6B-6F.

Figure 6B:
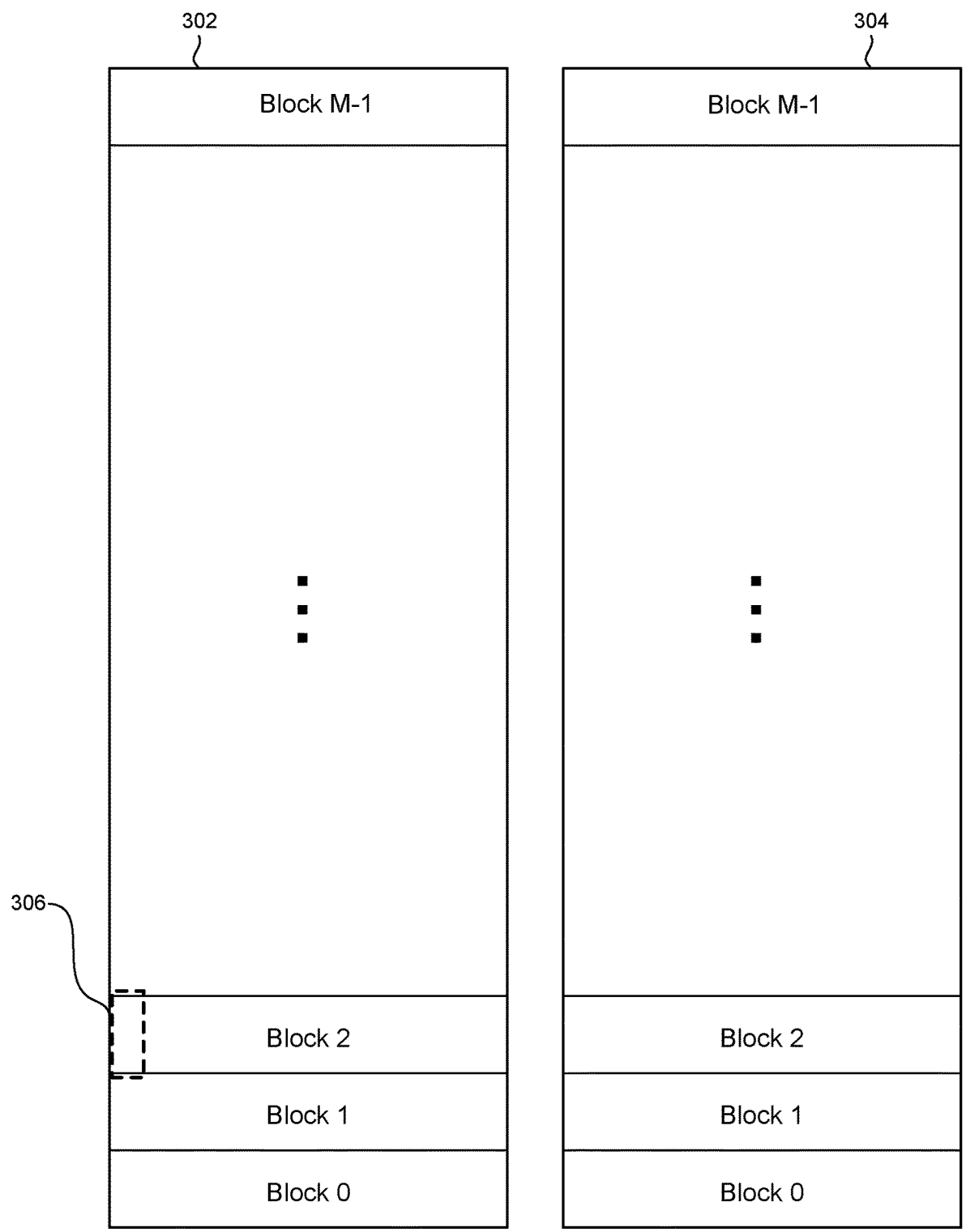
FIG. 6B is a block diagram of a memory structure having two planes.

FIG. 6B is a block diagram explaining one example organization of memory structure 326, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits.

Figure 6C:
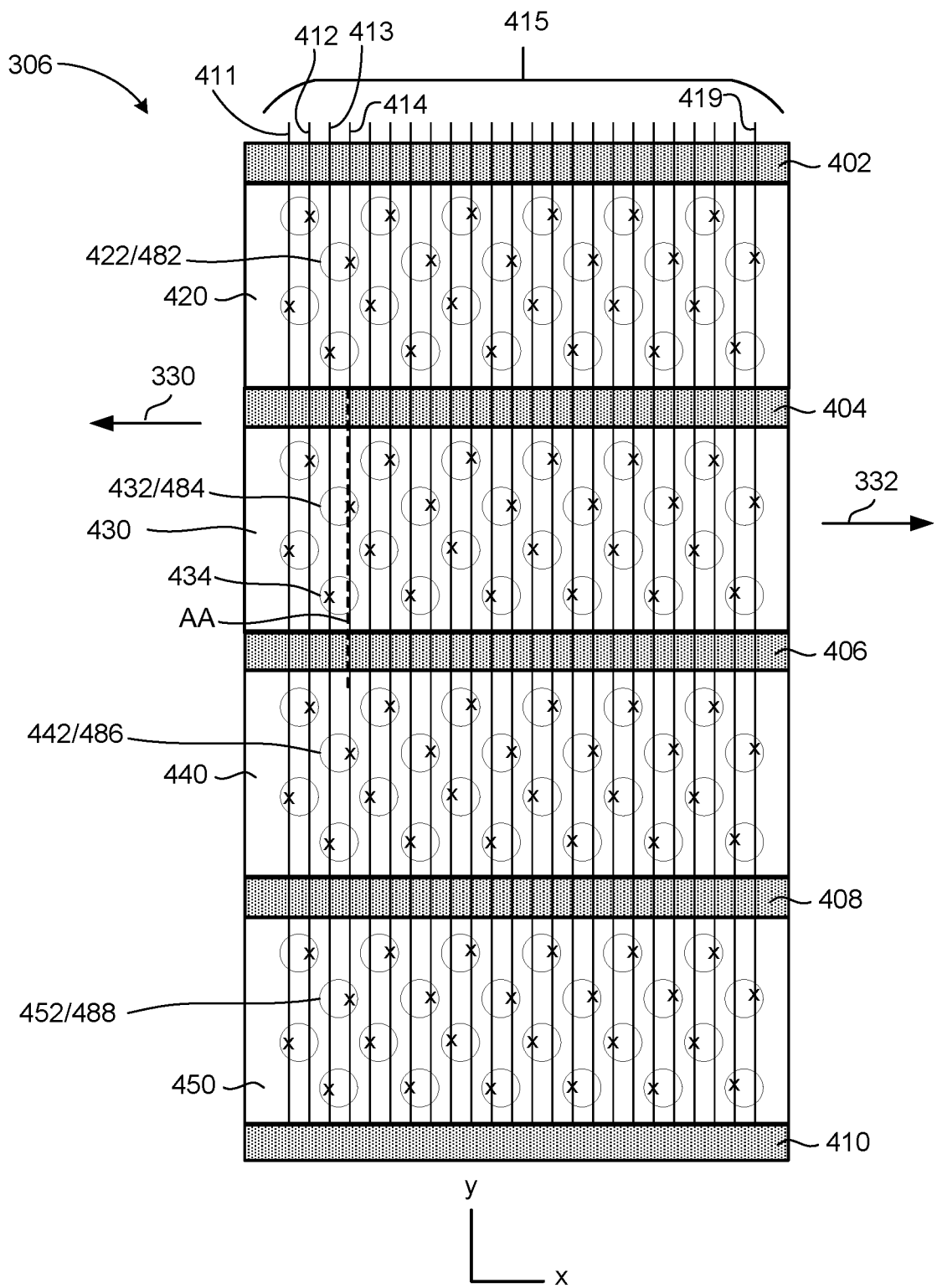
FIG. 6C depicts a top view of a portion of a block of memory cells.

FIGS. 6C-6F depict an example three dimensional ("3D") NAND structure. FIG. 6C is a block diagram depicting a top view of a portion of one block from memory structure 326. The portion of the block depicted in FIG. 6C corresponds to portion 306 in block 2 of FIG. 6B. As can be seen from FIG. 6C, the block depicted in FIG. 6C extends in the direction of 332. In one embodiment, the memory array will have 60-300 layers. However, FIG. 6C only shows the top layer.

FIG. 6C depicts a plurality of circles that represent the memory holes. Each of the vertical columns of the memory holes include multiple select transistors and multiple memory cells. In one embodiment, each memory hole implements a NAND string and, therefore, can be referred to as a memory column or memory hole. A memory column can implement other types of memory in addition to NAND. FIG. 6C depicts memory holes 422, 432, 442 and 452. Memory hole 422 implements NAND string 482. Memory hole 432 implements NAND string 484. Memory hole 442 implements NAND string 486. Memory hole 452 implements NAND string 488. More details of the vertical columns of memory holes are provided below. Since the block depicted in FIG. 6C extends in the direction of arrow 330 and in the direction of arrow 332, the block includes more memory holes than depicted in FIG. 6C FIG. 6C also depicts a set of bit lines 415, including bit lines 411, 412, 413, 414, . . . 419. FIG. 6C shows twenty-four-bit lines because only a portion of the block is depicted. It is contemplated that more than twenty-four-bit lines connected to memory holes of the block. Each of the circles representing memory holes has an "x" to indicate its connection to one bit line. For example, bit line 414 is connected to memory holes 422, 432, 442 and 452.

The block depicted in FIG. 6C includes a set of isolation areas 402, 404, 406, 408 and 410 that serve to divide each layer of the block into four regions; for example, the top layer depicted in FIG. 6C is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one memory hole in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns of the memory holes. In one embodiment, isolation areas 402, 404, 406, 408 and 410 are filled with a layer of $SiO_2$ (blocking) and a layer of poly-silicon (source line connection).

Although FIG. 6C shows each region having four rows of memory holes, four regions and sixteen rows of memory holes in a block, those exact numbers are an example implementation. Other embodiments may include more or less regions per block, more or less rows of memory holes per region and more or less rows of memory holes per block.

FIG. 6C also shows the memory holes being staggered. In other embodiments, different patterns of staggering can be used. In some embodiments, the memory holes are not staggered.

Figure 6D:
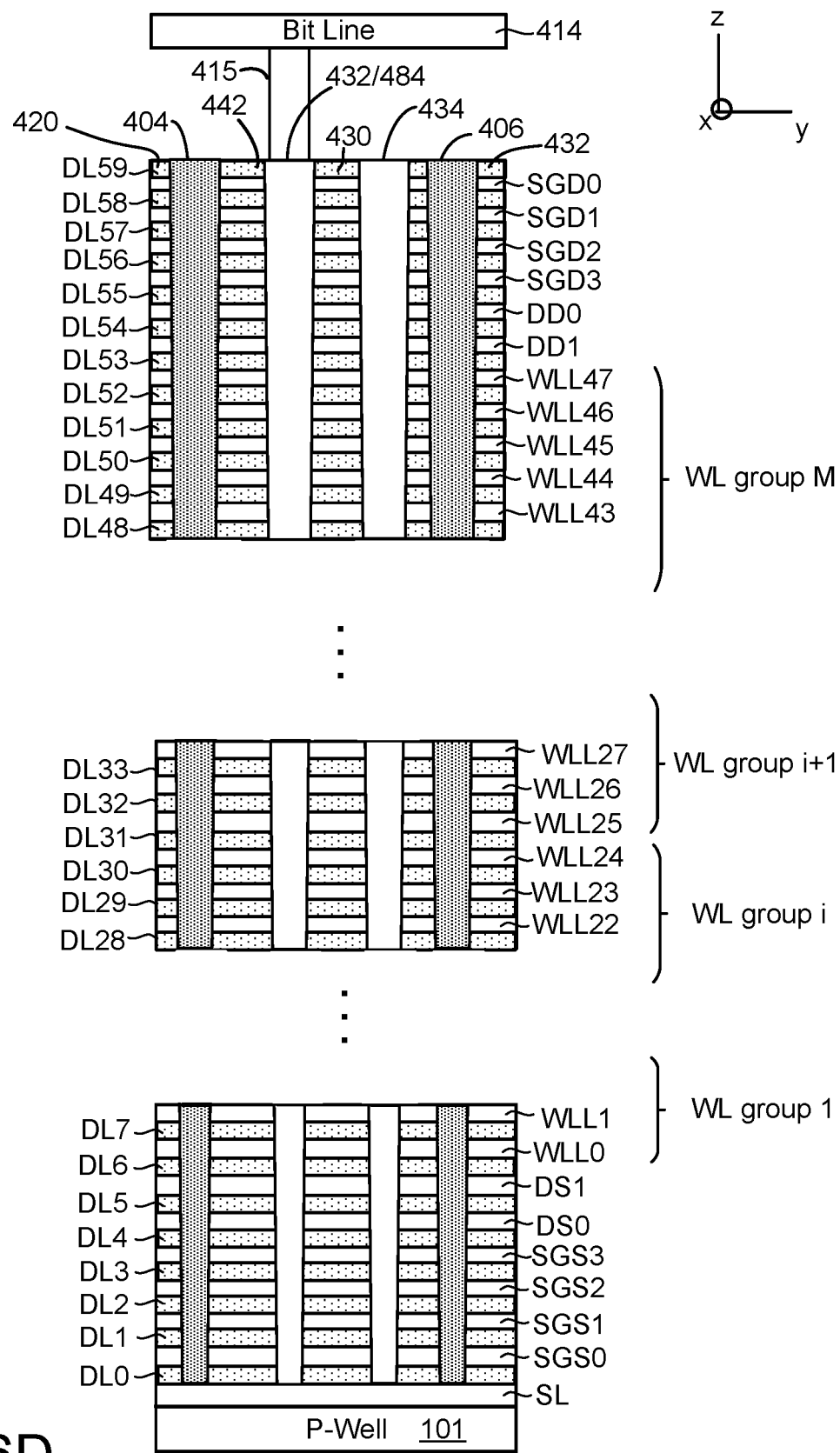
FIG. 6D depicts a cross sectional view of a portion of a block of memory cells.

FIG. 6D depicts a portion of an embodiment of three-dimensional memory structure 326 showing a cross-sectional view along line AA of FIG. 6C. This cross-sectional view cuts through memory holes 432 and 434 and region 430 (see FIG. 6C). The structure of FIG. 6D includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells as word line units of the memory cells connected to the word lines. Other embodiments can implement more or less than four drain side select layers, more or less than four source side select layers, more or less than four dummy word line layers, and more or less than forty-eight word line layers (e.g., 96 word line layers). Memory holes 432 and 434 are depicted protruding through the drain side select layers, source side select layers, dummy word line layers and word line layers. In one embodiment, each memory hole comprises a NAND string. For example, memory hole 432 comprises NAND string 484. The NAND string of memory hole 432 has a source end at a bottom of the stack and a drain end at a top of the stack. As in agreement with FIG. 6C, FIG. 6D show memory hole 432 connected to Bit Line 414 via connector 415. Isolation areas 404 and 406 are also depicted. Below the memory holes and the layers listed below, and over the underlying substrate, is source line SL and well region P-Well 401. A block of memory cells will share a common well region and in an erase operation, the erase voltage Verase is applied to the P-Well 401 and, through the source line SL, to channel region of the memory holes.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL51 is above word line layer WLL45 and below word line layer WLL46. In one embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In one embodiment, the memory cells are arranged in NAND strings. The word line layer WLL0-WLL47 connect to memory cells (also called data memory cells) to form word line units. Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 6E:
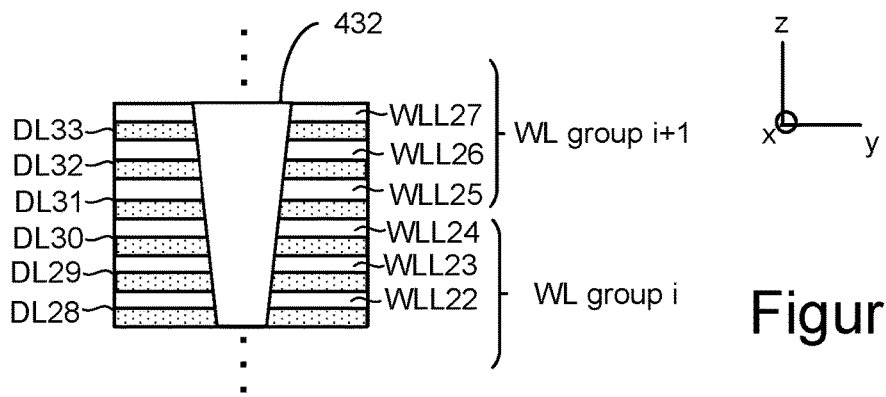
FIG. 6E is a detailed view of a portion of FIG. 6D illustrating the tapering of the memory holes.

As shown in FIG. 6D, the regions 432 and 434 not quite right cylinders, so that as the sides extend upwards in the z-direction the sides are not parallel. The process of forming memory holes typically results in the memory holes tapering, narrowing as they go deeper into the structure. FIG. 6E is a detail of a portion of FIG. 6D illustrating the tapering of the memory holes, but in an exaggerated form for purposes of discussion.

As shown in FIG. 6E, the column 432 narrows as it descends, being wider where it passes through word line layer WLL27 than where it passes through word line WLL22. Although this tapering is exaggerated in FIG. 6E, when looking at the entire stack of FIG. 6D the difference in memory hole diameter can vary significantly between the bottom of the stack and the top. This physical difference in structure on the different word line layers can lead to the word line layers acting differently. For example, due to the tapering of the memory holes, lower word lines tend to program faster than higher word lines that have a larger memory hole diameter. To account for these sorts of variations, the word lines can be split into word line groups and treated differently. FIG. 6D shows the word lines split up into M word line groups, where the number of such groups is a design decision based on balancing the complexity of more word line groups against the accuracy of accounting for variations in memory hole dimension.

Applying the grouping of word lines to compensate for the dimensional variation of the memory holes to the case of programming parameters can be used to enable the system to define which word line groups could use an additional program voltage offset on top of the default programming voltage. These parameters can specify higher or lower starting voltages, bigger or smaller step sizes and/or other variations in the programming waveform in order to meet performance requirements while still accounting for the variations in dimensions across the memory structure.

Figure 6F:
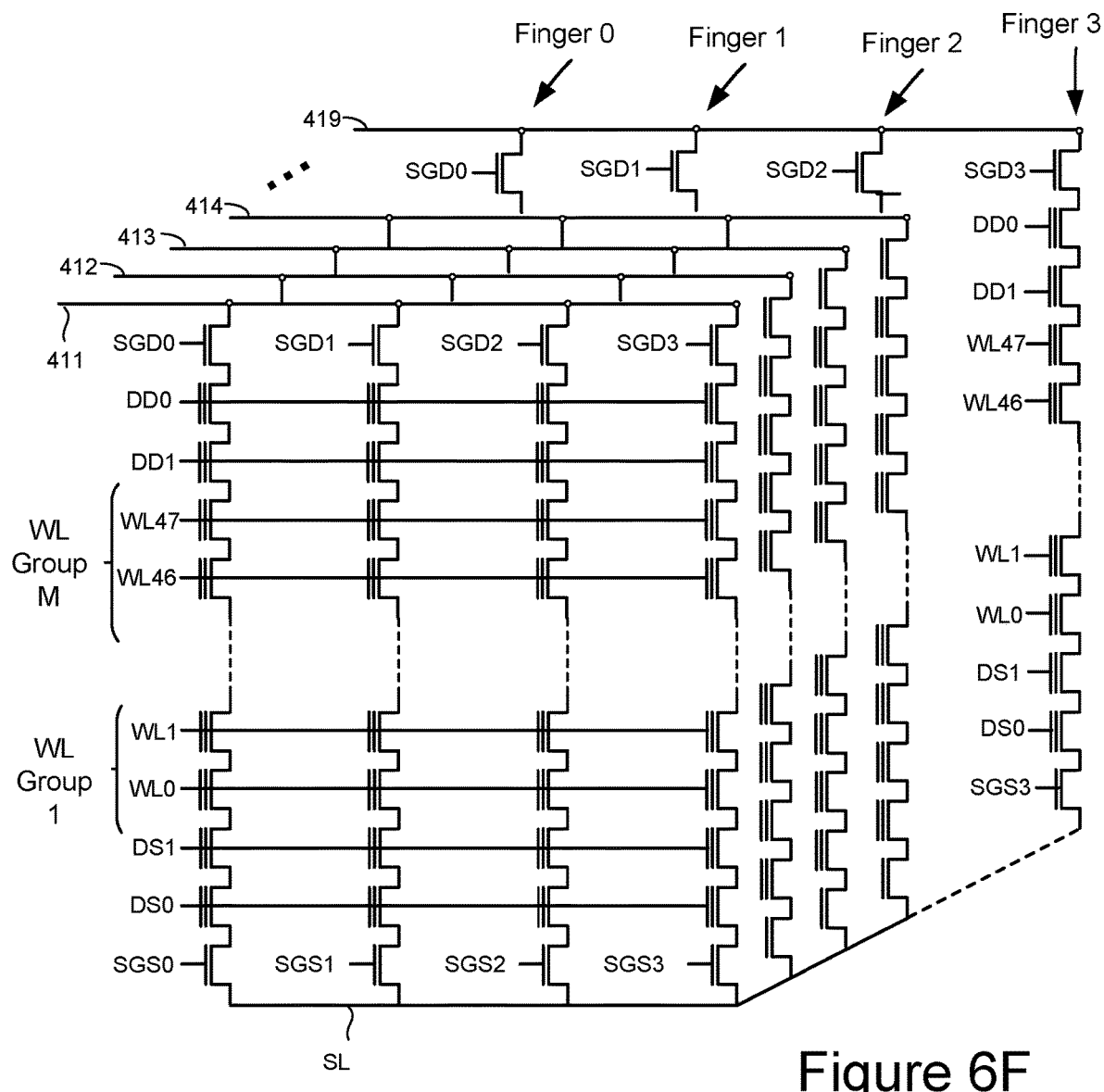
FIG. 6F depicts a view of the select gate layers and word line layers.

FIG. 6F depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 6D. As mentioned above with respect to FIG. 6C, in one embodiment isolation areas 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 7 illustrates example threshold voltage distributions for the memory cell array when each memory cell stores three bits of data. Other embodiments, however, may use other data capacities per memory cell (e.g., such as one, two, four, or five bits of data per memory cell). FIG. 7 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 7 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 7 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7 represent the full sequence programming. The technology described herein can also be used with other types of programming in addition to full sequence programming (including, but not limited to, multiple stage/phase programming). In some embodiments, data states S1-S7 can overlap, with controller 102 relying on ECC to identify the correct data being stored.

FIG. 8 is a table describing one example of an assignment of data values to data states. In the table of FIG. 8, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 8, all bits stored in a memory cell are 1 when the memory cells are erased (e.g., in data state S0).

Figure 9A:
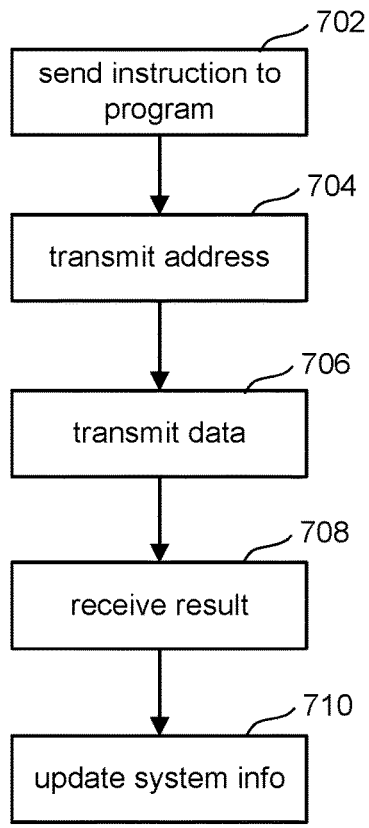
FIG. 9A is a flow chart describing one embodiment of a process for programming.

FIG. 9A is a flowchart describing one embodiment of a process for programming that is performed by controller 102. In some embodiments, rather than have a dedicated controller, the host can perform the functions of the controller. In step 702, controller 102 sends instructions to one or more memory die 300 to program data. In step 704, controller 102 sends one or more addresses to one or more memory die 300. The one or more logical addresses indicate where to program the data. In step 706, controller 102 sends the data to be programmed to the one or more memory die 300. In step 708, controller 102 receives a result of the programming from the one or more memory die 300. Example results include that the data was programmed successfully, an indication that the programming operation failed, and indication that the data was programmed but at a different location, or other result. In step 710, in response to the result received in step 708, controller 102 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 102 would receive host data and an instruction to program from the host, and the controller would run the ECC engine 226/256 to create codewords from the host data, as known in the art. These codewords are the data transmitted in step 706. controller can also scramble the data to achieve wear leveling with respect to the memory cells.

Figure 9B:
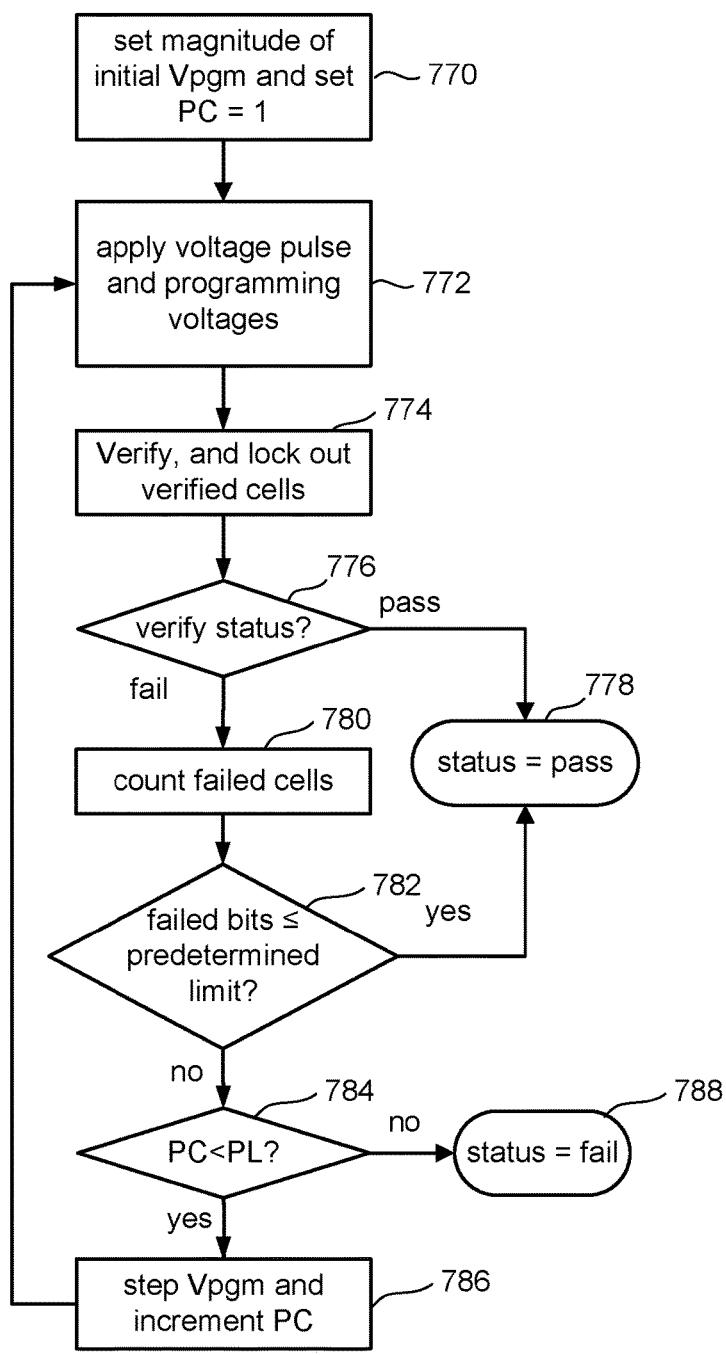
FIG. 9B is a flow chart describing one embodiment of a process for programming data into memory cells connected to a common word line.

FIG. 9B is a flowchart describing one embodiment of a process for programming. The process of FIG. 9B is performed by the memory die in response to the steps of FIG. 9A (i.e., in response to the instructions, data and addresses from controller 102). In one example embodiment, the process of FIG. 9B is performed on memory die 300 using the one or more control circuits discussed above, at the direction of state machine 312. The process of FIG. 9B can also be used to implement the full sequence programming discussed above. Additionally, the process of FIG. 9B can be used to implement each phase of a multi-phase programming process.

Typically, the program voltage applied to the control gates (via a selected common word line) during a program operation is applied as a series of program voltage pulses. Between program voltage pulses are a set of verify voltage pulses to perform verification. In many implementations, the magnitude of the program voltage pulses is increased with each successive voltage pulse by a predetermined step size. In step 770 of FIG. 9B, the programming voltage (Vpgm) is initialized to the starting magnitude (e.g., ~12-16V or another suitable level) and a program counter PC maintained by state machine 312 is initialized at 1. In step 772, a voltage pulse of the program signal Vpgm is applied to the selected word line (the word line selected for programming). In one embodiment, the group of memory cells being programmed concurrently are all connected to the same common word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program voltage pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next voltage pulse will have a magnitude greater than the previous voltage pulse by a step size (e.g., a step size of 0.1-0.5 volts). After step 786, the process loops back to step 772 and another voltage pulse is applied to the selected word line so that another iteration (steps 772-786) of the programming process of FIG. 9B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 7) or verify operation (e.g. see verify reference voltages Vv1, Vv2, Vv3, Vv4, Vv5, and Vv7 of FIG. 7) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 102 receives a request from the host (or a client, user, etc.) to program host data (data received from the host) into the memory system. In some embodiments, controller 102 arranges the host data to be programmed into units of data. For example, controller 102 can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Step 772 of FIG. 9B includes applying a program voltage pulse on the selected word line. Step 774 of FIG. 9B includes verification, which in some embodiments comprises applying the verify reference voltages on the selected word line. As steps 772 and 774 are part of an iterative loop, the program voltage is applied as a series of voltage pulses that step up in magnitude. Between program voltage pulses, verify reference voltages are applied. This is depicted in FIG. 9C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

FIG. 9C shows a verify pulse for each of the non-erased states S1-S7 between each of the program voltage pulses 792, 794 and 796. These verify pulses consume a significant portion of a program operation. As the number of states stored per memory cell increases, this situation becomes worse, limiting programming speed. FIG. 9C corresponds to 3-bits per cell and uses 7 verify levels. In a 4-bit per cell embodiment, a verify of all non-erased states would need 15 verify operations between program voltage pulses. To improve performance, some of these verify levels can be skipped at various points of the programming operation through use of an "intelligent" or "smart" verify algorithm. As higher states take longer to program, initially only the lowers states are verified, with the high states being added progressively as the program operation proceeds. Similarly, after some number of voltage pulses, the lower states can progressively be dropped as cells being written to the level will either have completed programming or considered defective.

Figure 9D:
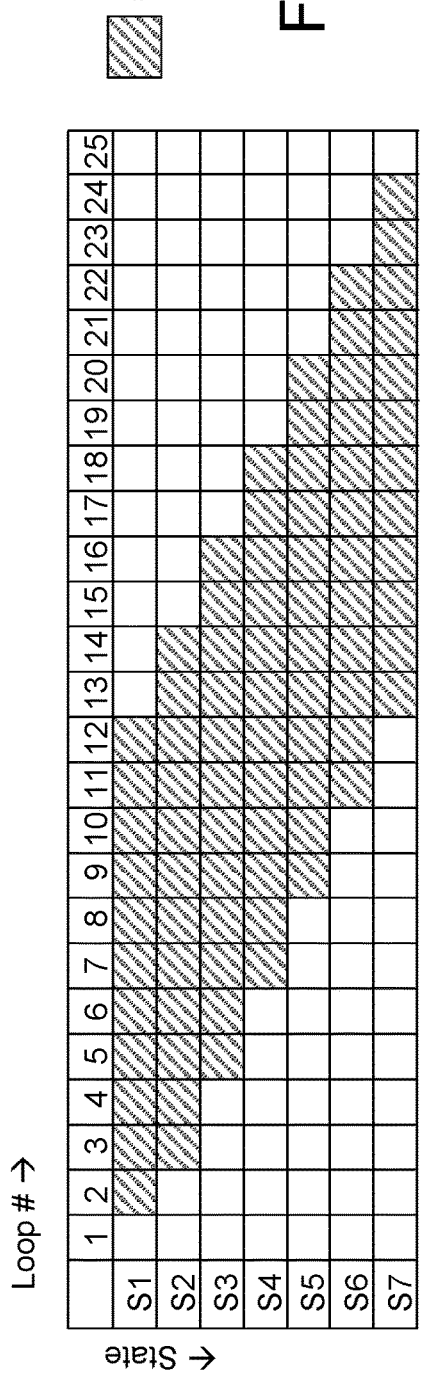
FIG. 9D illustrates the use of a smart verify algorithm.

FIG. 9D illustrates one embodiment for a smart verify algorithm for a 3-bit per cell embodiment, illustrating which data states would be verified after a given voltage pulse. More specifically, FIG. 9D plots the target state to which a cell is being programmed against the program loop number, or number of voltage pulses that have been applied, in a smart verify algorithm. The shaded squares correspond to the states verified after the voltage pulse of each loop, where the smart verify arrangement checks only those states likely to still be programming for non-defective cells. For example, after the 13th voltage pulse, the lowest state S1 has been dropped, while states S2-S7 are being verified, with this being the initial verify at the level corresponding to the state S7. In this embodiment, this reduces the number of inter-pulse verifies to no more than six, rather the full 15 that would be needed if all states were verified. When to add and drop states can be determined in a number of ways. For example, these could be parameters determined and set based on device characterization tests. In some embodiments, these parameters could depend on factors such as the number of program/erase cycles to take into account device aging, as memory cells often program faster as they are cycled. Alternately, or additionally, states can be added or dropped based on the results of earlier verify operations. For example, if at the initial verify for, say, the state S4 more or less than the expected number of cells verify, verifies for S5 and other higher states can be introduced sooner or later; and if a given all memory cells being written to a given data state are found to have completed programming, subsequent verifies for that state can be dropped.

Due to the physical structure difference in word lines from the tapering of memory holes (see FIG. 6E), lower word lines tend to be faster to program as compared to upper word lines, which have larger memory hole critical dimensions. To compensate for this variation, the word lines can be split into groups, such as illustrated in FIG. 6D. These figures show the word lines split up into M word line groups, where the number of such groups is a design decision based on balancing the complexity of more word line groups against the accuracy of accounting for variations in memory hole dimension. Within a group, the variations due to the physicality of the memory holes are generally small enough that a common set of operating parameters can be used. The availability of different parameters for different word line groups enables the memory device to define different programming parameters for each of the word line groups. For example, slower to program word line groups can start the programming voltage staircase waveform at a higher value, starting the programming voltage (Vpgm) at a raised voltage level that is offset above a default value by some amount. However, even when being able to tune the programming parameters of each word line group individually, due to programing speed variation with a word line group, due to improper tuning the groups programming parameters, or both, a word line may still program too rapidly.

In verifying a memory cell at step 774 of FIG. 9B, the memory system determines whether a memory cell has been sufficiently programmed. Referring back to FIG. 7, a memory cell with a target state of S3, for example, will verify as correctly programmed once it has a threshold voltage of Vv3 or higher. Memory systems typically do not check to see how far over the Vv3 level a memory cell with the target state of S3 is programmed, so that if the memory cell is over-programmed such that its threshold voltage is at Vr4 or higher, it will verify as correctly programmed but read back as a higher data state. The over-programming can result from the programing waveform starting with too high an initial value, from too large a step size in the programming waveform, or from the verification for a target state starting too late in the programming sequence. Still considering the example of the S3, referring to FIG. 9D, the S3 state is first verified at loop number 5. If a memory cell with whose target is S3 is already over-programmed at this point, even though it will be locked out from subsequent programming, it will still have a threshold of Vr4 or higher and read erroneously. This is illustrated with respect to FIG. 10.

Figure 10:
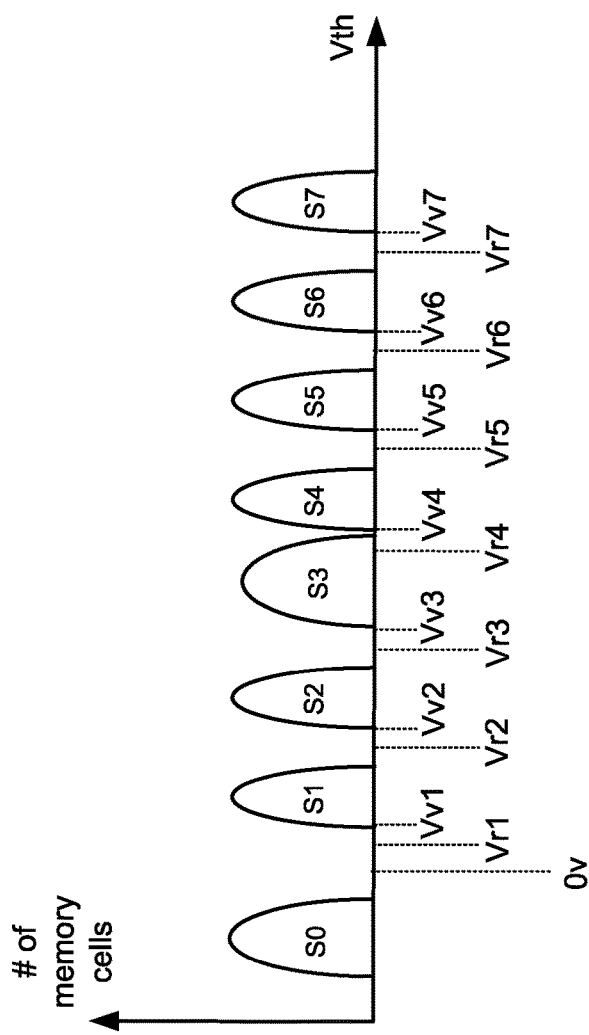
FIG. 10 illustrate an example of threshold voltage distributions when one of the states is prone to over-programming.

FIG. 10 illustrates an example of threshold voltage distributions for the memory cell array when each memory cell stores three bits of data, similarly to FIG. 7, but when some of the memory cells programmed to the S3 state are over-programmed. For the states other than S3, the distributions is as in FIG. 7, with all of the memory cells of a given target data state having the lower end of their distribution above the corresponding verify level, but below the read level of the next state. For example, the distribution the S2 state is above Vv2, but below Vr3 so that when read back these memory cells will read as the S2 state. For the S3 distribution, however, although all of the memory cells have threshold voltages above Vr3, some have been programmed above Vr4, flattening out the distribution and moving its upper end towards a higher Vth. Consequently, all of these memory cells of the S3 distribution will verify correctly as based on the Vv3 level, when read back some of the memory cells will read as being in the S4 state. This can result in an uncorrectable ECC (UECC) result, where the number of erroneously programmed memory cells is more than the ECC algorithm can handle.

Figure 11:
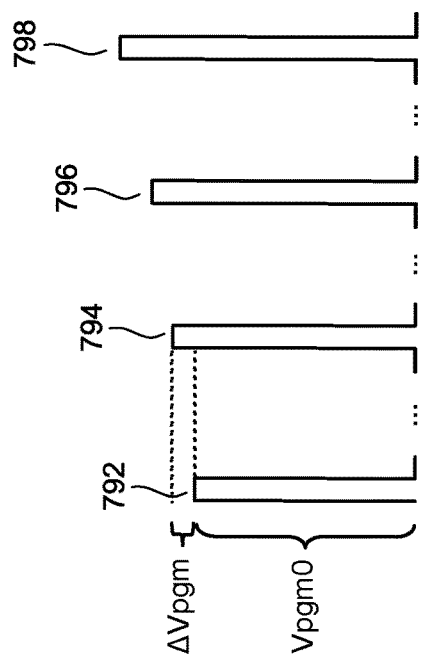
FIG. 11 illustrates parameters that can be used to define a programming waveform applied to a word line.

FIG. 11 illustrates a programming waveform applied to a word line, similar to FIG. 9C but with the inter-pulse verify portion of the waveform omitted. The initial pulse 792 has an initial amplitude of Vpgm0, with each of the subsequence pulses 794, 796, 798 increased by a step size of $\Delta$Vpgm. As discussed above with respect to FIGS. 6D and 6E, due to the tapering in the diameters of memory holes, the speed at which memory cells along a word line vary with the position of the word line in the stack. To account for this, the word lines in the different word line groups WL group 1 to WL group M illustrated in FIGS. 6D and 6F can have their programming waveform adjusted based on the word line group. For example, as the word lines of the lowest group WL group 1 program faster than WL group 2, which is in turn faster than WL group 3, and so on to WL group M, the programming waveform for WL group 1 can have a lower Vpgm0 amplitude than WL group 2, and similarly for the each of higher groups. In addition to varying the programming waveform based on the WL group, the programming waveform can also be varying to account for different behavior of the different memory die of the memory packages 104 and for different blocks or regions of blocks on a given die.

To use the appropriate programming waveform for a given word line based on its word line group, die, or region of the die, the memory system can maintain corresponding sets of programming parameters. For example, a set of parameters can specify the Vpgm0, $\Delta$Vpgm, or other values to use when programming a selected word line. The parameters can be maintained in a number of formats, such the amplitudes themselves or off-sets from nominal values. The parameters can be maintained as digital values which are then translated into analog voltage levels by the power control module 316 (FIG. 5) on a memory die 300. During operation, the programming parameters for a given die can be maintained by the die itself, on the controller and supplied to the die as part of a programming command, or a combination of these based. If these programming parameters are incorrect, or correct but improperly implemented by the power control module 316, the programming waveform will be incorrect for the word line.

When the parameters used in operating the memory device are anomalous, either through the value itself being inaccurate or being improperly implemented, this can lead to error, as described above for the programming parameters, but also for parameters associated with reading and erase. This problem can occur when a device is new, but can also develop with cycling as a memory die is subjected program/erase cycles as the device ages. Referring to the above discussion, an anomalous value for the programming parameter Vpgm0 can cause an over-program on a selected word line. As a programming operation can still pass the verify operation without reporting out a program fail status, this can potentially overwhelm the memory system's error correction capability and lead to reporting out an uncorrectable error correction (UECC) result to the host. Another issue that can result from a high bit error rate (BER) is when this portion of the memory is scanned, it will be refreshed by reading out data, correcting it, and rewriting it. However, as any data written back to a block suffering from this problem will again be over-programmed, this can lead to this block being continuously refreshed, and subjecting it to a high number of program/erase cycles.

As discussed above with respect to FIGS. 6D and 6E, due to the tapering of memory holes, the lower (i.e., closer to the source line) a word line is in the stack, the faster it will program. A consequence of this is that for word lines at the boundary between word line groups, such as word line 25 in WL group i+1 of FIG. 6D, this issue is more pronounced. This sort of behavior can serve as a signature for this problem. Although screening for this problem when new devices are tested can catch fresh devices that have this problem, it can result in high yield loss and also will not check this problem when it arises after the device is in use. The following presents techniques for catching such parameters anomalies based on a signature of the problem and handling it at a system level.

Figure 12:
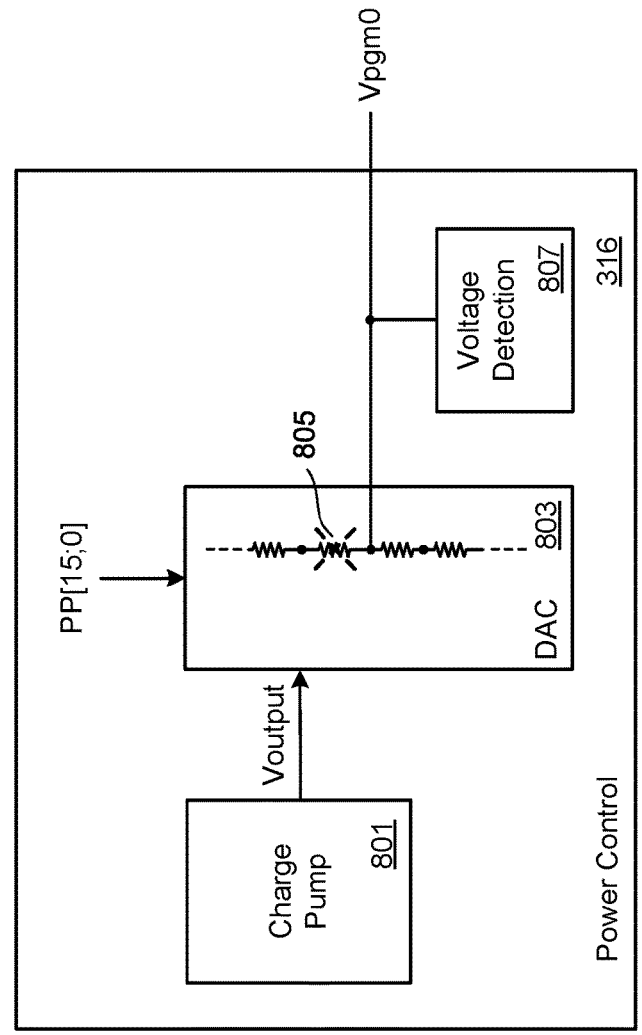
FIG. 12 is a schematic representation of some elements of the power control module involved in generating the programming voltage.

The Vpgm0 values (the initial programming voltage magnitude) is generated by the power control module 316 of the memory die 300 of FIG. 5. Although FIG. 5 is a schematic representation, in an actual memory die the array structure or structures 326 typically occupy the central portion of the die 300, with charge pumps, regulator circuits, digital to analog converters and other elements of power control module 316 formed around the edges, where they are more vulnerable. FIG. 12 is a schematic representation of some elements of the power control module 316 involved in generating the programming voltage Vpgm0.

As shown in FIG. 12, a charge pump circuit 801 generates a high output voltage Voutput. The needed programming values can then be generated from this value by regulators, digital to analog converters, and other power supply elements. In the block diagram of FIG. 12, the output Voutput is received at a digital to analog converter DAC 803. DAC 803 receives the Voutput voltage from charge pump 801 and then steps this down to provide Vpgm0 and other programming voltages. The DAC 803 can receive a digital programming parameter value PP[15:0], which is here taken to have a 16 value, but other sizes can be used depending on the embodiment. The set of the parameter values can be kept on the memory die and, based on the location of the selected word line and target state, supplied to the DAC 803 as needed. Alternately, the could be maintained on the controller 102 supplied by the controller as part a programming instruction. The power control circuit can also include a voltage detection circuit 807 configured to measure the output of the DAC 803, where the use of such a measure can be used to determine the accuracy of Vpgm0, as described below with respect to FIG. 17.

In some embodiments, in addition to or as alternatively to keeping such operating parameters on the memory die, copies of system operating parameters can be stored in RAM memory on the controller 102, where they can be readily accessed. In some embodiments, the system can maintain such information on the memory cells' voltage threshold distributions time tag.

To operate more efficiently, a memory system can maintain system data, including metadata on the user data, to be able to operate more efficiently. A common example of such metadata is the number of program/erase (P/E) cycles that each of the blocks have experience, as this information is a good indicator of the block's relative wear and can useful in managing the memory for processes such as wear leveling, which can important for maintaining well-defined threshold distributions as illustrated in FIG. 7. In some embodiments, the system can maintain such information on the memory Cells' Voltage threshold Distributions (CVD) time tag, including operating parameters such as the Vr and Vv values for reading and verifying the different data states as illustrated in FIG. 7, as well as programming parameters such as those illustrated with respect to FIG. 11. For example, the memory processor 230/260 can maintain the CVD time tag data 231/251 in the SRAM 230/260 of FIG. 3. Rather than use a fixed set of parameters, whose accuracies may change over time and not account for variations between different die or variations within a given die, maintaining separate set of parameters for different groups of blocks, such as sets of blocks corresponding to the different regions of the different die of the memory system, can allow for more accurate operation of the memory device; and rather than establishing optimized parameters for a block each time it is accessed, as in a dynamic read operation, this allows for the operating parameters to readily available, with updates only performed occasionally or when needed. In the case programming parameters, different values can be maintained for each of the word line groups corresponding the different word line layer, as illustrated by the WL groups of FIGS. 6D and 6F.

FIG. 13 is a schematic representation of some of the metadata information that can be included in CVD time tag embodiments. In the example of FIG. 13, a CVD time tag includes an ID of information identifying the physical blocks it covers, such as a range or ranges of physical block addresses. The CVD time tag can also include a time stamp to indicate when the current parameters of a given CVD time tag was set. The parameters kept in the CVD time tag can include the set of read parameters ([Vr]) for the different states and the set of program verify parameters ([Vv]) for the different states. These can be presented as digital values that would be converted analog voltages by a digital-to-analog (DAC) conversion on the memory circuit. Other examples of parameters presented by the CVD time tag can include the program parameters [PP], such as amplitude of the initial programming pulse for each state and step size for the different word line groups. In some embodiments, the CVD time tag can also include information on operating conditions (such as temperature) at the time of programming. The controller can keep the CVD time tags in RAM memory, such as SRAM 230/260 of FIG. 3 or SRAM 260 of FIG. 2, where they can be accessed as needed. The controller can maintain copies of the CVD time tags in non-volatile memory, from where they can be loaded to the controller's RAM at power up.

The DAC 803 then translates Voutput to the analog voltage Vpgm0 based other the parameter value PP0[15:0], such as through use of a voltage divider as illustrated schematically by the resistor chain inside DAC. As a memory die ages and undergoes program erase cycles, the conversion of the programming parameter to the Vpgm0 can show some anomaly, which can cause the sort of over-program described with respect to FIG. 10 for the S3 state, causing the upper end of the S3 distribution to merge into the S4 distribution. For example, if a resistor of the chain in DAC fails, as indicated schematically by the X-ed out transistor 805, the DAC 803 will provide too high a Vpgm0 value.

The regulating resistors of the power supply block can be made of polysilicon or made of well resistor, for example. Over time, due to stress, the polysilicon resistor or the contact to the resistor can developed crystal dislocation that causes its resistance to change, thus leading to the wrong regulation. Another source of the problem can be inadequate circuit design that causes a transistor used to implement the resistor to become over-stressed. If the gate of the transistor implementing a resistor is at high voltage, but the drain is switching between high and low voltages to pass current through the transistor, the transistor can suffer from "Hot-Switching" effect. This may cause the transistor source or drain junction to become leaky over time, which in turn leading to wrong voltage delivered through the transistor. This is due to the sudden high energy electrons flowing through the transistor (since the gate is at high voltage already) that will damage the junction physical structure.

As lower word lines in the 3D structure illustrated in FIGS. 6A-6F program faster, the effect of an elevated Vpgm0 will be more pronounced for the word lines at the lower boundary of a WL group. This effect is illustrated with respect to FIG. 14.

Figure 14:
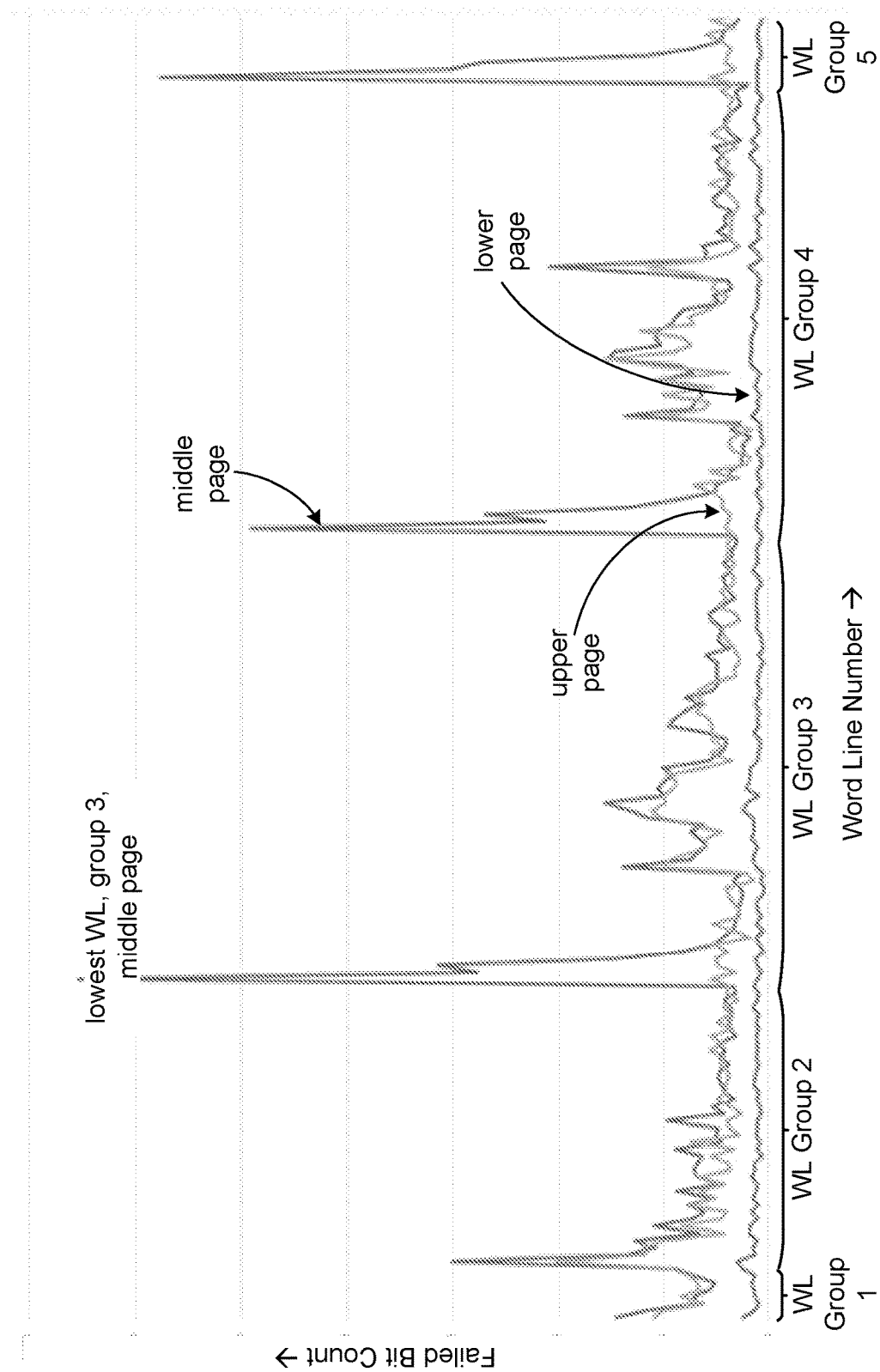
FIG. 14 illustrates a higher incidence of over-programming on word line group boundaries.

Continuing to use the example where memory cells being programmed to the S3 state are suffering from the over-programming, FIG. 14 illustrates a higher incidence of over-programming on word line group boundaries for different data pages. In FIG. 14, the horizontal axis corresponds to word line number and the vertical axis the bit error rate on a word line. Data is stored with three bits per cell in a lower, middle and upper page format, with the three pages being shown. Referring back to FIG. 8, the lower page and upper page are both 0 for the S3 and S4 state, so that if memory cells meant for the S3 state are over-programmed into the S4 state, the lower and upper data pages will not reflect this error. For the middle page, however, S3=0 and S4=1, so that an over-programmed S3 will cause an error in the middle page of data. This is reflected in FIG. 14.

In FIG. 14, the BER for the lower and upper pages fluctuate across the word line numbers, but within a relatively confined range. In contrast, the BER for the middle page shows pronounced spike at intervals corresponding to the word line number starting a WL group. For example, at the lower end of WL group 2 the lowest word line of the group and the next several word lines is a pronounced peak in the failed bit count, corresponding to a high BER rate. The BER then drops off and exhibits BER fluctuations similar to the upper page though the rest of WL group 2. At the start of the nest WL group (WL group 3), where another set of programming parameters starts, is another peak for the BER. This behavior, of the middle page showing over-programming concentrated at the first word lines of a word line group, can be used as a signature for identification of an anomalous programming parameter of the S3 Vpgm0 value.

FIG. 15 is a table of examples of the Vpgm0 values used for different word line groups for a passing die (read pass die) and a failing die (read fail die). This example is for when the word lines of a block are split into 5 WL groups. The Vpgm0 values are expressed as offsets relative to the value used for WL group 3 of Vpgm0=VpgmU, with the lower word line groups offset by negative amount and the higher word line groups offset by a positive amount. In FIG. 15, the middle column illustrates the Vpgm0 values of the different word line groups of a die that fails by having a high BER for one or more word lines when read back. The last column illustrates a die that passes when read. The Vpgm0 values agree for all of the word line groups except for WL group 5, where for the pass read die Vpgm0=VpgmU+0.4V, but for the read fail die Vpgm0=VpgmU+0.8V. This elevated Vpgm0 value will result in the sort of signature illustrated in FIG. 14, where the anomalous Vpgm0 values can result from either the parameter value being wrong or incorrectly implemented by the peripheral circuitry. Consequently, this information provides a good indication as to what is causing the higher, failing bit count, as can be confirmed by comparing the values between the different die of the memory system. Other useful information is the X-Y location of a memory die on the wafer it came from, as integrated circuits from the same area of a wafer often exhibit similar behavior as they see similar processing. This X-Y location information a memory die is often accessible by the controller and can be used to determine other die from a similar location as a die with this problem, as this may also behave similarly.

Therefore, this issue is typical only on a die that has a certain periphery defect. The value to which programming parameters are trimmed for a fresh device might look the same across dies at time-0, but because of periphery degradation (such due to program/erase cycling), a given programming parameter supplied to the DAC 803 of FIG. 12 that used to correspond to, say 1V, will now correspond to 1.4V. Because of this, the programming parameter corresponds to the intended value of 1V on a good die, while corresponding to 1.4V the degraded die.

To help solve the problem of anomalous operating parameters, when the memory detects the signature of such a problem, such as a higher BER on the word ling group boundaries in the case of programming parameters, the memory system can confirm the issue. For the case of anomalous programming parameters, the memory system can measure the failed bit count (FBC) on the word line group boundaries to confirm the issue. Once the issue is confirmed, the firmware can obtain the value for Vpgm0 from the failing die and compare this to the values for Vpgm0 on the other die, such as for the other memory die in the same in the same memory package. If the memory system finds that the translation of the programming parameter into the Vpgm0 voltage value on the failing die is offset by an amount above some pre-determined threshold, then the programming parameter setting can be trimmed on the failing die based on this comparison. Trimming the value of the programming parameter for Vpgm0 on the fly will bring down the voltage for programming and therefore would not result in over-programming.

Figure 16:
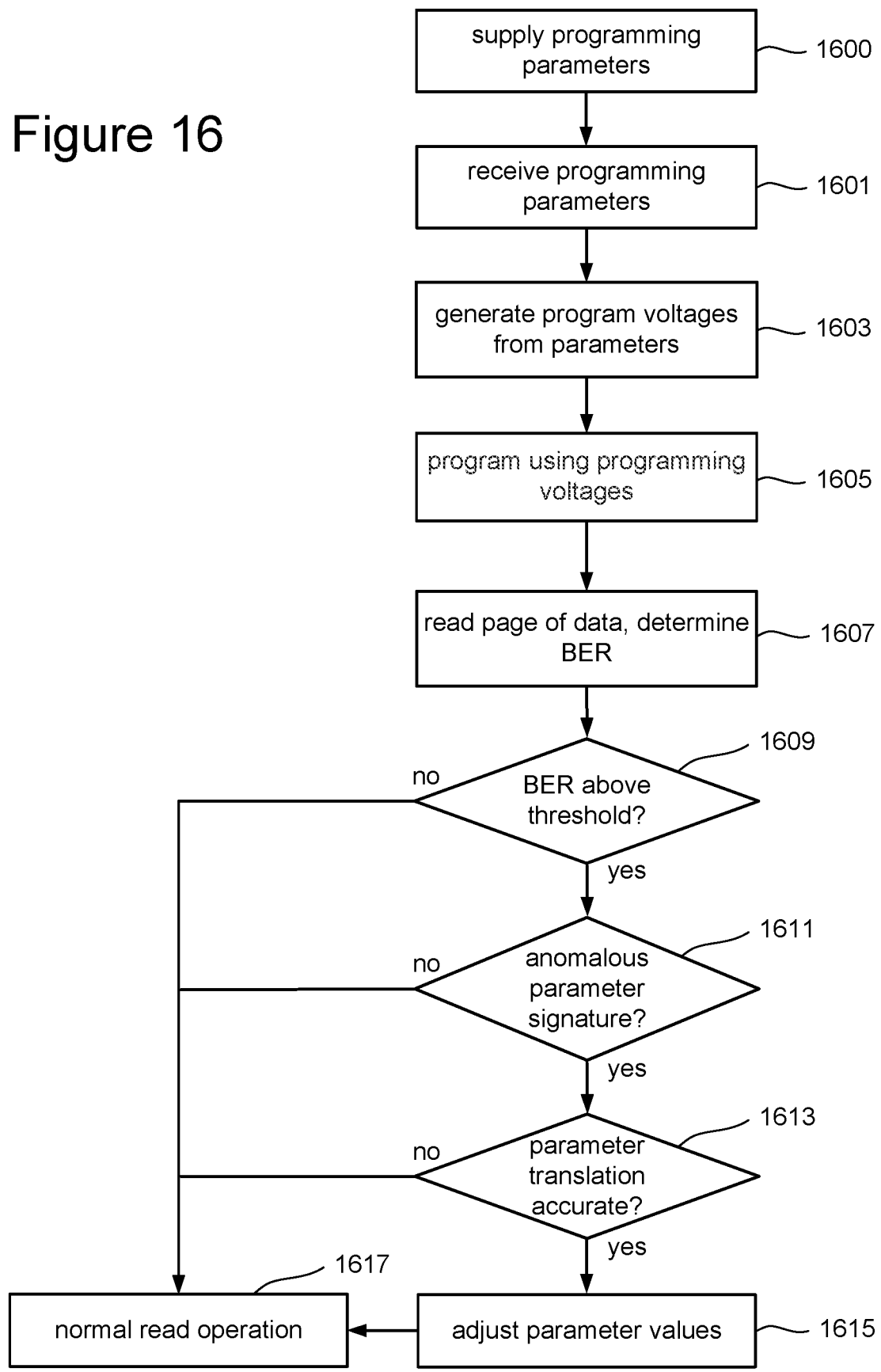
FIG. 16 is a flow chart describing one embodiment for programming one or more pages of data using a programming parameter and subsequently determining whether the parameter is anomalous.
Figure 17:
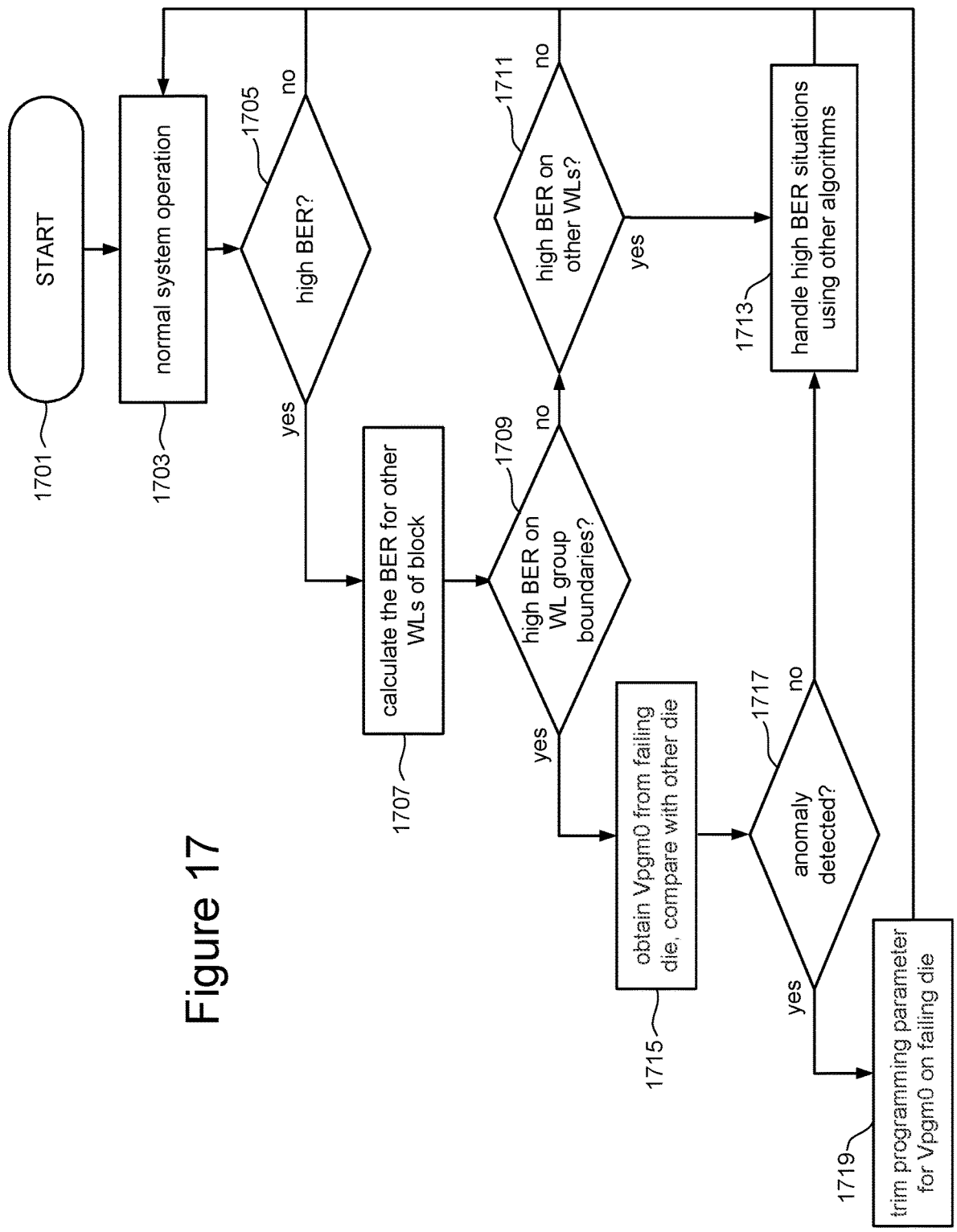
FIG. 17 is a flow chart of describing one embodiment providing more detail for the process of trimming programming parameters for a die experiencing over-programming due to anomalous parameter values.
Figure 18:
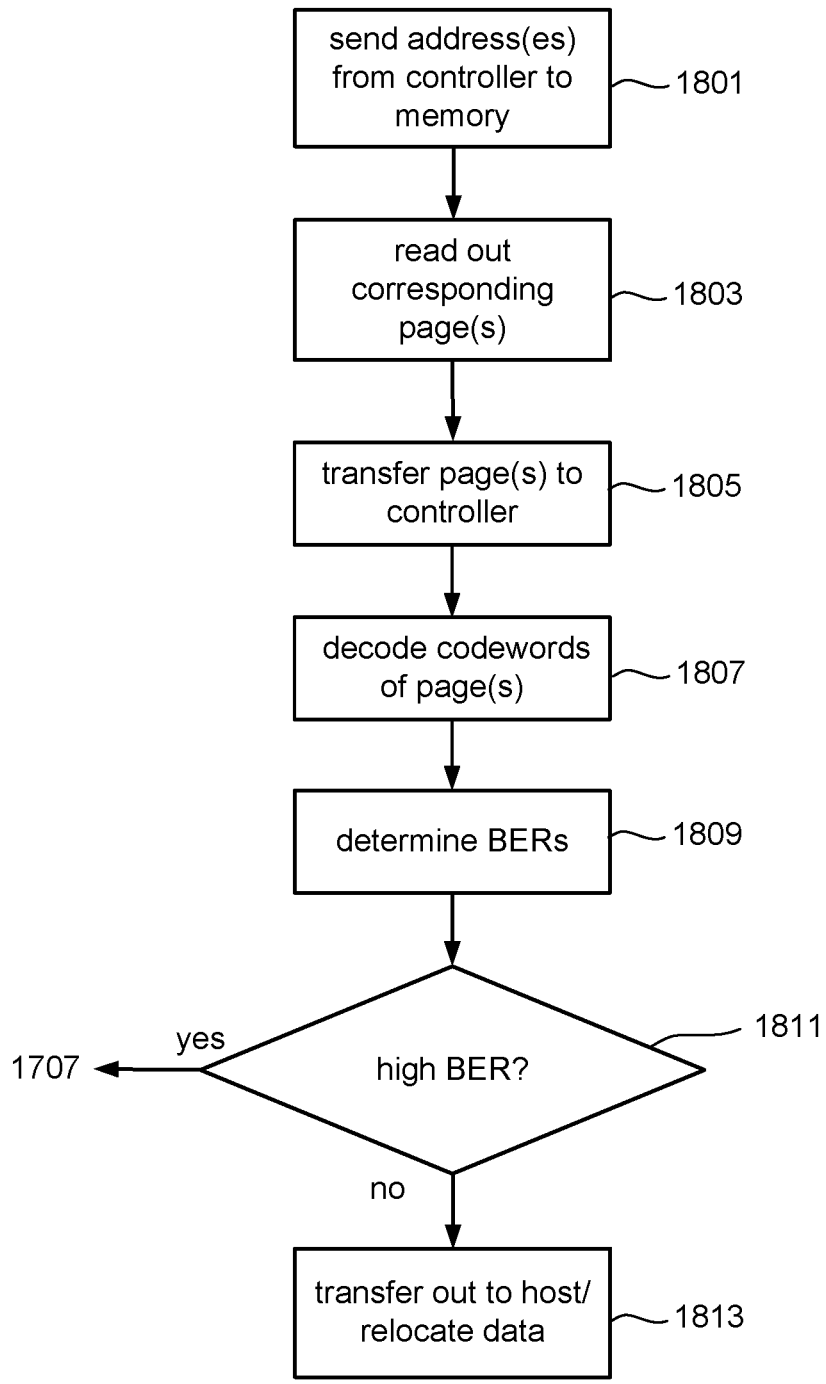
FIGS. 18 and 19 are flow charts describing embodiments for some of the steps of FIG. 17.
Figure 19:
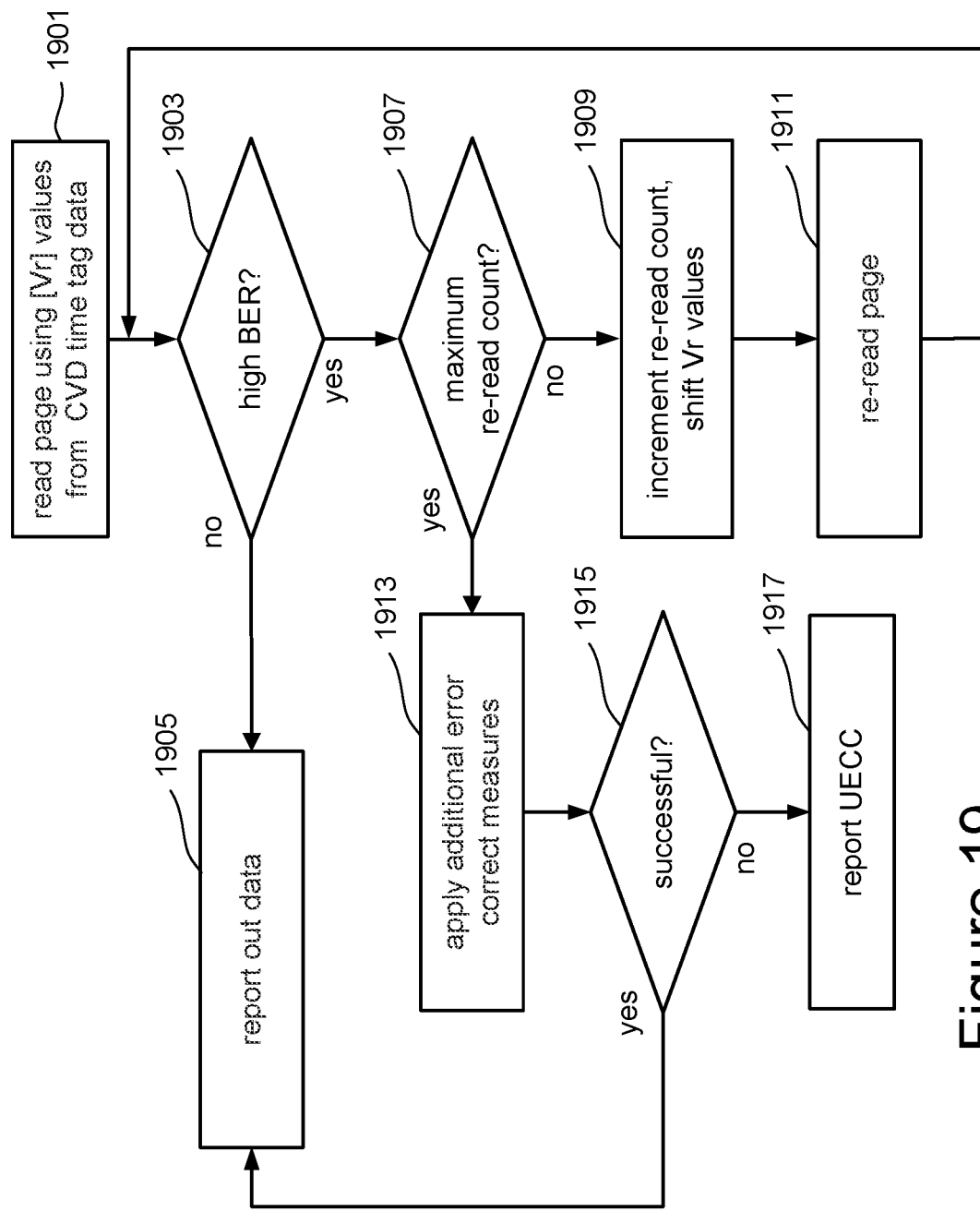

FIG. 16 is a flow chart describing one embodiment for programming one or more pages of data using a programming parameter and subsequently determining whether the parameter is anomalous. FIG. 17 is a flow chart of describing one embodiment providing more detail for the process of trimming programming parameters for a die experiencing over-programming due to anomalous parameter values. FIGS. 18 and 19 are flow charts describing embodiments for some of the steps of FIG. 17.

Referring now to FIG. 16, at step 1600 the programming parameters are supplied to the power control module 316. Depending on the embodiment, the programming parameters can already be available on the die and supplied by the on-chip control circuitry 310, or supplied by the controller 102, such as from the CVD time tags 231/261. At step 1601 the power control module 316 receives a programming parameter corresponding to the addressed word line and data at the DAC 803 of FIG. 12. At step 1603, the programming parameters are translated into programming voltages. Programming the addressed word line with the page of data occurs at step 1603, where embodiments for a programming operation are described above with respect to FIGS. 9A-9D. If the programming parameters are accurately translated at step 1603, the programming will occur with typical accuracy; but if there is a parameter anomaly, either due to the programming parameter being wrong or incorrectly translated, an incorrect programming voltage may be generated leading to a higher incidence of over-programming.

At a later time, the data programmed at step 1605 is read back, where this can be a read request from the host 120 or a read generated on the controller 102, such as for garbage collection or data refresh operations. A page of the data programmed at step 1605 is read at step 1607 and a determination of the BER for the page of data is made as part of the decoding of the ECC encode page of data. Step 1609 tests for whether the page of data has a high bit error rate, comparing the BER of the page of data to a threshold value that can be based on the type and strength of the ECC algorithm being used. If the BER is below the threshold level, a normal read process continues at step 1617, where the data is supplied to the host 120 for a host read or used for a controller generated operation such as garbage collection. If the BER is over the threshold value, at step 1611 a check is made for a signature of anomalous programming parameters, such as by checking the BER on other word lines, which is described in more detail with respect to FIG. 17.

If a signature is not found at step 1611, the flow goes to the normal read process of step 1617, which can include using error correction techniques on the page of data. If a signature is found at step 1611, the translation of the programming parameters to programming voltages of step 1603 is checked at step 1613. If the translation is accurate, the flow goes to the continuation of the normal read process at step 1617; and if the translation is off, the parameters are adjusted at step 1615 before continuing to step 1617. Steps 1607-1615 are considered in more detail in FIG. 17.

FIG. 17 is a flow chart describing additional detail for one embodiment for the process of trimming programming parameters for a die experiencing over-programming due to anomalous parameter values. FIGS. 18 and 19 are flow charts describing embodiments for some of the steps of FIG. 17. Once the flow of FIG. 17 starts at 1701, the system moves on to normal operation at step 1703, including the reading of previously programmed pages of data, as can be illustrated with respect to FIG. 18.

FIG. 18 is a flow chart describing one embodiment of step 1703 for reading out pages of data and determining their BERs in more detail. At step 1801, the controller 102 sends a read command for one or more pages of data to the one of the memory die of memory packages 104. The read request can be a request by the host 120 for reading data or an internal request originating with the controller 102, such as for a refresh operation or garbage collection. At step 1803, the addressed memory die, such as a die 300 on one of memory packages 104, reads out the requested page or pages. For example, in the 3-bit per cell embodiment illustrated in FIGS. 7 and 8, the read operation can be performed by the sense blocks 350 including SB1, SB2, . . . , SBp of read/write circuits 328 using the read reference voltages, [Vr]=Vr1, Vr2, Vr3, Vr4, Vr5, Vr6, and Vr7. For embodiments using a CVD time tag as illustrated with respect to FIG. 13, the set of [Vr] values can be obtained from the corresponding CVD time tag. At step 1805, the read pages are transferred from the memory die of memory packages 104 to the controller 102. In the case where multiple pages are being read, these steps and the subsequent steps can be performed sequentially for a series of requested pages.

Once a page of data is at the controller 102, at step 1807 the codewords of the page are decoded by the ECC engine 226/256. As part of the process of decoding the codewords and extracting their data content, ECC engine 226/256 can also determine bit error rates for the pages read at step 1809. At step 1811, which also corresponds to step 1705 of FIG. 17, the controller can determine whether the BER rate is high. The ECC engines 226/256 have an error correction capacity dependent on the type of ECC used and strength of the encoding, which in turn depends on the number of bits of ECC data used for a set of user data. The comparison of 1811 can use a BER threshold value that is sufficiently below the correction limit of the ECC engines 226/256 in order to try to catch and deal with anomalous programming parameter error before it overwhelms the ECC capacity of the system.

If the BER rate is below the threshold value at step 1811, normal system operation continues and at step 1813 the data is transferred out to the host 120, if the data was in request to a host read, or put to the use for which the controller 102 requested it if the request was internal. For example, if the controller 102 requested the data for a refresh operation, the read and corrected data would be re-written back into one of the memory die 300 of memory packages 104. If a high BER is detected at step 1811, the flow then goes to step 1707 of FIG. 17.

As noted above, the comparison of step 1811 of FIG. 18 is equivalent to step 1705 of FIG. 17 and in response to a high BER rate at step 1811/1705, the flow goes to step 1707 of FIG. 17. Picking up the flow of FIG. 17 at step 1707, steps 1707 and 1709 determine whether the error displays the signature of a programming parameter anomaly. As discussed above with respect to FIG. 14, a signature for the programming parameters not being correctly translated into program voltage levels is a higher incidence of error for word lines along the lower word lines of a word line group. For example, for over-programmed S3 states, this will correspond to the middle pages of such word lines having a higher BER. To this end, at step 1707 additional pages of data are read from the block containing the page found to have a high BER at step 1705. This can include reading all of the pages from all of the word lines of the block, or subset of these pages; for example, only particular pages (e.g., the middle page), only particular word lines (such as on word line group boundaries), or both can be read.

Step 1709 looks at the BERs calculated at step 1707 and looks for the signature of anomalous programming parameters. In the example here, this includes checking the BER of neighboring pages stored on or near the boundary of a word line group. For example, referring back to FIG. 13, if the BER for a middle data page on the lower word lines of a word line group is significantly higher than for the upper word lines on the adjacent word line group, this indicates that the Vpgm0 has an anomalous value. If the signature is not found at step 1709, the flow goes to step 1711 and considers error on the other word lines. If there is a high BER on other word lines, the flow goes to step 1713; if not, the flow loops back to normal memory operation at step 1703. If the signature is found at step 1709, the flow goes to step 1717 to check whether the programming voltages are or are not correctly corresponding to the programming parameters.

Steps 1715 and 1717 determine whether the detected signature does actually correspond to an anomaly in the translation of the programming parameter by comparing the programming voltage that the die is generating from the programming parameter with an example of what the programming voltage should be were it accurately translated. The value of the programming voltage can be measured, such as though use of the voltage detection circuit 807 of power control circuit 316. In the embodiment described herein, this is done at step 1715 by going to one or more other memory die of the memory system and seeing the corresponding programming voltage that they generate from the programming parameter. Referring back to the table of FIG. 15, this figure illustrates how the same programming parameter is translated to a programming voltage for the die where the high BER is detected and one of the die of the memory system with a high BER rate. Still referring to FIG. 15 and looking at WL group 5, the Vpgm0 value for the die with the high BER can be compared to the same Vpgm0 value for another die without a corresponding high BER rate. These programming voltages are compared and step 1717 determines whether there is an anomaly, in that the voltages generated from the same parameters on different die do not agree. If the programming voltages do agree, then this indicates that there is not a programming parameter anomaly and the high BER is likely due to another cause, which is dealt with at step 1713. If the programming voltages do not match, the programming parameter, such as the values [PP] maintained in the CVD time tag embodiment illustrated with respect to FIG. 13, is trimmed at step 1719 to a value that translates in to the correct programming voltage on the die with the high BER. The trimming of the programming parameters [PP] may require several iterations before the appropriate value is found to provide the correct Vpgm0 value. For example, after trimming the value, the word line with the high BER can be reprogrammed using the trimmed parameter and read back to determine the resultant BER using the trimmed parameter, where, depending on the resultant BER using the trimmed parameter, the process could be repeated one or more times. After trimming the programming parameter at step 1719, the flow loops back to normal memory operation at step 1703.

Referring back to step 1713, this can be included in the flow to handle error that arises from sources other than an anomalous programming parameter. In the flow of FIG. 17, step 1711 can follow from step 1711 if the anomalous programming parameter signature is not found at step 1709, but a BER is still found at step 1711. Step 1713 can also follow from step 1717 if the signature of an anomalous programming parameter is found at step 1709, but not confirmed at step 1717. Consequently, step 1713 is concerned with errors that arise from other sources and are therefore dealt with by other techniques. FIG. 19 provides more detail on step 1713 and considers some example of dealing with such errors, where, following step 1713, the flow again loops back to step 1703.

A high BER on a page of data can arise from a number of causes, such as an anomalous programming parameter that leads to over-programming that is considered in the flow of FIG. 17, or due to other causes, such as disturbs or charge leakage. Disturbs arise when a memory operation on a selected memory cell or set of memory cells affect the data state of other non-selected memory cells. These effects can cause the well defined distributions of FIG. 7 to spread, often shifting the threshold voltages of memory cells downward, but where some disturb mechanism may also raise a memory cell's threshold voltage.

FIG. 19 is a flow chart describing step 1713 in more detail for one embodiment for handling word lines having a high BER, but which was determined not to due to a programming parameter anomaly. FIG. 19 begins with the reading of a word line at step 1901, where this can be part of the normal system operation of step 1703 of FIG. 17. In one set of embodiments, the read of step 1901 can be performed using the set of read parameters [Vr] form the CVD time tag, as discussed above with respect to FIG. 13. Once the page is read, as described above with respect to FIGS. 17 and 18, step 1903 determines whether the page has a high BER. Step 1903 can be equivalent step 1705 of FIG. 17. If a high BER is not found, the page of date is reported out at step 1905, which is again part of the normal system operation of step 1703 of FIG. 17. If a high BER is found at step 1903, and this is not determined as due to a programming parameter anomaly, the flow goes to step 1907.

In steps 1907, 1909 and 1911, the memory system re-tries reading the page with shifted read voltage parameters, trying to shift the Vr values from the set of values [Vr] in the CVD time tag, trying to optimize the read threshold voltages in order to extract the data content of the page. To place a limit on the number of re-tries, step 1907 checks whether a maximum number of re-read attempts has been reached. If not, the count for the number of re-reads is incremented and the Vr values are shifted at step 1909. Step 1911 then performs the re-read with the shifted Vr values at step 1911. The flow loops back to step 1903 to check the BER rate on the re-read, either reporting out the data at step 1905 if the BER is low, or returning to step 1907 if the BER is still high.

At step 1907, once the maximum count for the re-read loop is reached and the BER is still high, the flow goes to step 1913. At step 1913, the memory system can use other features to try and recover the data content of the page, if such measures are available. For example, the XOR engines 224/254 of FIG. 3 can be used to XOR data so that data can be combined and stored in a manner that can be recovered in case there is a programming error. The XOR feature can be used at step 1913. Step 1915 determines whether the data has been recovered at step 1913: if so, the data is reported out at step 1905; and if not, an uncorrectable ECC error (UECC) status is reported out at step 1917.

The ability to determine and correct over-programming due to anomalous programming parameters can allow the memory system find and correct a source of error before it becomes so great as to overwhelm the memory system's capacity for correction of such error. By monitoring bit error rates along word lines and determining whether a high BER has the signature of such a programming parameter anomaly, the memory system can confirm and correct for this problem. By adjusting the programming parameters, a memory that would otherwise have too high of an error rate can continue to be used. Additionally, as such a die, if uncorrected, would continue to verify data as correctly programmed but read the data back with a high BER, this would avoid such a die being repeatedly erased and reprogrammed during refresh and garbage collection operations, which could quickly age the die.

One embodiment includes an apparatus having array of non-volatile memory cells, a power control circuit, and one or more control circuits. The non-volatile memory cells of the array are connected along one or more word lines. The power control circuit is configured to receive a programming parameter value and translate the programming parameter into a programming voltage. The one or more control circuits are configured to supply the programming parameter to the power control circuit and program memory cells along a first word line of the array using the programming voltage. The one or more control circuits are further configured to subsequently read the first word line of the array and, in response to the read of the first word line of the array having an amount of error above a threshold value, determine whether the power control circuit accurately translates the programming parameter values into the programming voltage.

One embodiment includes a method that includes generating a programming voltage according to a programming parameter value. A page of data is programmed into memory cells along a first word line are programmed using the programming voltage. The page of data is subsequently read from the memory cells along the first word. In response to the page of data as read having a high bit error rate, the first programming voltage is compared to a reference value. The value of the programming parameter value for use by the first power control circuit is trimmed in response to a difference between the first programming voltage and the reference value One embodiment includes an apparatus including a memory die and one or more control circuits. The memory die comprises a first power control circuit configured to generate a programming voltage according to a programming parameter and an array of non-volatile memory cells. The one or more control circuits are configured to maintain a value for the programming parameter; program a data set into the array of the first die using the programming voltage generated by the first power control circuit according to the value for the programming parameter; and, in response to a subsequent error result for a read of the data set, adjust the value for the programming parameter.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a first array of non-volatile memory cells including one or more word lines connected to the memory cells;
a first power control circuit connected to the word lines and configured to receive a programming parameter value and translate the programming parameter value into a programming voltage; and
one or more control circuits connected to the first power control circuit, the one or more control circuits configured to supply the programming parameter value to the first power control circuit and program memory cells along a first word line of the first array using the programming voltage, the one or more control circuits further configured to subsequently read the first word line of the first array and, in response to the read of the first word line of the first array having an amount of error above a threshold value, determine whether the first power control circuit accurately translates the programming parameter value into the programming voltage.

2. The apparatus of claim 1, wherein:
the one or more control circuits are configured to determine whether the first power control circuit accurately translates the programming parameter value into the programming voltage by reading one or more additional word lines, determining an amount of error for each of the one or more additional word lines, and determining whether the amount of error for the first word line and the one or more additional word lines have a signature of an inaccurately translated programming parameter value.

3. The apparatus of claim 2, wherein:
the signature of an inaccurately translated programming parameter value is a difference in amounts of error between different ones of the first word line and the one or more additional word lines.

4. The apparatus of claim 3, wherein:
the word lines of the first array are divided into a plurality of contiguous groups and the signature of an inaccurately translated programming parameter value is a difference in amounts of error between neighboring word lines from different ones of the groups.

5. The apparatus of claim 2, wherein:
in response to determining that the amount of error for the first word line and the one or more additional word lines have the signature of an inaccurately translated programming parameter value, the one or more control circuits are configured to measure the programming voltage and compare the programming voltage to a reference voltage.

6. The apparatus of claim 5, wherein the:
first array and the first power control circuit on formed on a first memory die and the one or more control circuits are further configured to determine the reference voltage by measuring a programming voltage generated by a second power control circuit on a second memory die by translating the programming parameter value.

7. The apparatus of claim 1, wherein:
the one or more control circuits are further configured to trim the value of the programming parameter value in response to determining that the first power control circuit does not accurately translate the programming parameter value into the programming voltage.

8. The apparatus of claim 1, wherein:
the first array and the first power control circuit on formed on a first memory die, the first power control circuit being formed on a periphery of the first die.

9. The apparatus of claim 1, wherein:
the one or more control circuits maintain the programming parameter value in RAM memory.

10. The apparatus of claim 1, further comprising:
a voltage detection circuit formed on a first memory die with the first array and the first power control circuit, the voltage detection circuit configured to measure the value of the programming voltage, and
wherein the one or more control circuits are configured to compare the measured value of the programming voltage to a reference value to determine whether the first power control circuit accurately translates the programming parameter value into the programming voltage.

11. A method comprising:
- generating a first programming voltage corresponding to a programming parameter value;
- programming a page of data into memory cells along a first word line using the first programming voltage;
- subsequently reading the page of data from the memory cells along the first word line;
- in response to the page of data as read having a high bit error rate, comparing the first programming voltage to a reference value; and
- trimming the value of the programming parameter value for use by a first power control circuit in response to a difference between the first programming voltage and the reference value.

12. The method of claim 11, wherein the first programming voltage corresponding to the programming parameter is generated by the first power control circuit formed on a first memory die, and wherein comparing the first programming voltage to reference value comprises:
- measuring a voltage level of the first programming voltage;
- generating a second programming voltage corresponding to the programming parameter value by a second power control circuit formed on a second memory die;
- measuring a voltage level of the second programming voltage to determine the reference value; and
- comparing the voltage level of the first programming voltage with the determined reference value.

13. The method of claim 12, wherein:
- trimming the value of the programming parameter value for use by the first power control circuit is in response to the comparing the voltage level of the first programming voltage with the voltage level of the second programming voltage and finding a difference between the voltage level of the first programming voltage and the voltage level of the second programming voltage.

14. The method of claim 12, wherein in the first word line is part of a memory array, the method further comprising:
- reading the memory cells along each of one or more additional word lines of the memory array;
- determining an amount of error for data stored in the memory cells along each of the one or more additional word lines; and
- performing a comparison of the amount of error for a plurality of the first word line and the one or more additional word lines, wherein the comparing the first programming voltage to reference value is performed in response to the comparison.

15. The method of claim 14, wherein:
- the first word line belongs to an array having a plurality of word lines, the plurality of word lines divided into a plurality of contiguous groups, and performing a comparison of the amount of error for a plurality of the first word line and the one or more additional word lines includes comparing the amount of error between neighboring word lines from different groups.

16. An apparatus, comprising:
- a first memory die, comprising:
  - a first power control circuit configured to generate a programming voltage according to a programming parameter; and
  - an array of non-volatile memory cells; and
- one or more control circuits configured to maintain a value for the programming parameter, program a data set into the array of the first die using the programming voltage generated by the first power control circuit according to the value for the programming parameter, and, in response to a subsequent error result for a read of the data set, adjust the value for the programming parameter.

17. The apparatus of claim 16, further comprising:
- a second memory die, comprising:
  - a second power control circuit configured to generate a programming voltage according the programming parameter,
- wherein, in response to the subsequent error result, the one or more control circuits are configured to:
  - perform a comparison of the programming voltage generated by the first power control circuit according to the value for the programming parameter with the programming voltage generated by the second power control circuit according to the value for the programming parameter; and
  - adjust the value for the programming parameter based on the comparison.

18. The apparatus of claim 16, wherein:
- the error result is a bit error rate of data programmed into memory cells along a word line of the array of the first memory die.

19. The apparatus of claim 16, wherein:
- the first memory die is a monolithic three-dimensional semiconductor memory device in which the memory cells are arranged in multiple physical levels above a substrate, comprise a charge storage medium, and are connected along word lines running horizontally above the substrate.

20. The apparatus of claim 19, wherein:
- word lines of the first memory die are divided into a plurality of contiguous groups and the one or more control circuits are configured to determine the error result based on a difference in an amount of error between neighboring word lines from different ones of the groups.

* * * * *